United States Patent
Kub et al.

(10) Patent No.: US 10,777,644 B2
(45) Date of Patent: Sep. 15, 2020

(54) HETEROJUNCTION DEVICES AND METHODS FOR FABRICATING THE SAME

(71) Applicant: GOVERNMENT OF THE UNITED STATES OF AMERICA, AS REPRESENTED BY THE SECRETARY OF THE NAVY, Arlington, VA (US)

(72) Inventors: Francis J. Kub, Arnold, MD (US); Travis J. Anderson, Alexandria, VA (US); Marko J. Tadjer, Springfield, VA (US); Andrew D. Koehler, Alexandria, VA (US); Karl D. Hobart, Alexandria, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/965,478

(22) Filed: Apr. 27, 2018

(65) Prior Publication Data
US 2018/0315820 A1  Nov. 1, 2018

Related U.S. Application Data

(60) Provisional application No. 62/490,915, filed on Apr. 27, 2017.

(51) Int. Cl.
*H01L 29/267* (2006.01)
*H01L 29/24* (2006.01)
(Continued)

(52) U.S. Cl.
CPC ........ *H01L 29/267* (2013.01); *H01L 29/0619* (2013.01); *H01L 29/24* (2013.01);
(Continued)

(58) Field of Classification Search
CPC ........ H01L 29/267; H01L 29/24; H01L 29/78
(Continued)

(56) References Cited

U.S. PATENT DOCUMENTS

| | | | |
|---|---|---|---|
| 2014/0217405 A1* | 8/2014 | Sasaki | H01L 29/7813 257/43 |
| 2015/0325620 A1* | 11/2015 | Itahashi | H01L 27/1461 348/308 |

(Continued)

OTHER PUBLICATIONS

Kokubun, "All-oxide p—n heterojunction diodes comprising p-type NiO and n-type β-Ga2O3" Applied Physics Express, vol. 9, No. 9, Aug. 30, 2016.

(Continued)

*Primary Examiner* — Igwe U Anya
(74) *Attorney, Agent, or Firm* — US Naval Research Laboratory

(57) ABSTRACT

Current conducting devices and methods for their formation are disclosed. Described are vertical current devices that include a substrate, an n-type material layer, a plurality of p-type gates, and a source. The n-type material layer disposed on the substrate and includes a current channel. A plurality of p-type gates are disposed on opposite sides of the current channel. A source is disposed on a distal side of the current channel with respect to the substrate. The n-type material layer comprises beta-gallium oxide.

15 Claims, 32 Drawing Sheets

(51) Int. Cl.
 H01L 29/78 (2006.01)
 H01L 29/861 (2006.01)
 H01L 29/80 (2006.01)
 H01L 29/66 (2006.01)
 H01L 29/06 (2006.01)
 H01L 29/16 (2006.01)
 H01L 29/20 (2006.01)
 H01L 29/10 (2006.01)

(52) U.S. Cl.
 CPC .. *H01L 29/66666* (2013.01); *H01L 29/66916* (2013.01); *H01L 29/66924* (2013.01); *H01L 29/66969* (2013.01); *H01L 29/7827* (2013.01); *H01L 29/7828* (2013.01); *H01L 29/802* (2013.01); *H01L 29/861* (2013.01); *H01L 29/8611* (2013.01); *H01L 29/0657* (2013.01); *H01L 29/1066* (2013.01); *H01L 29/1602* (2013.01); *H01L 29/2003* (2013.01); *H01L 29/242* (2013.01)

(58) Field of Classification Search
 USPC .......................................................... 257/43
 See application file for complete search history.

(56) References Cited

U.S. PATENT DOCUMENTS

| | | | |
|---|---|---|---|
| 2015/0325660 A1* | 11/2015 | Hitora | H01L 29/7722 257/43 |
| 2016/0141372 A1* | 5/2016 | Sasaki | H01L 29/78 257/43 |
| 2017/0025437 A1* | 1/2017 | Walker | H01L 27/11582 |
| 2017/0213918 A1* | 7/2017 | Sasaki | C30B 29/16 |

OTHER PUBLICATIONS

M.J. Tadjer, "A (001) β-Ga 2O 3 MOSFET with +2.9 V Threshold Voltage and HfO Gate Dielectric," ECS Journal of Solid State Science and Technology, 5 (9) p. 468-p. 470 (2016).

Wei Wei et. al., "Valence band offset of B-Ga2O3/wurtzite GaN heterostructure measured by X-ray photoelectron Spectroscopy," Nanoscale Research Letters 2012, 7:562.

* cited by examiner

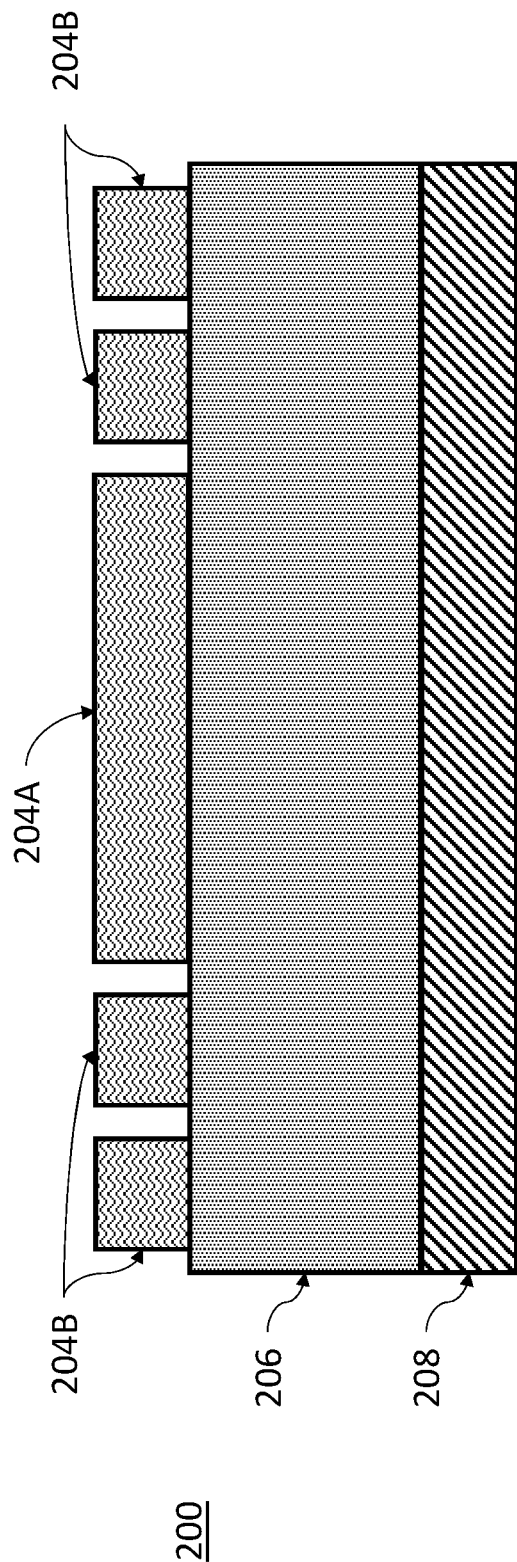
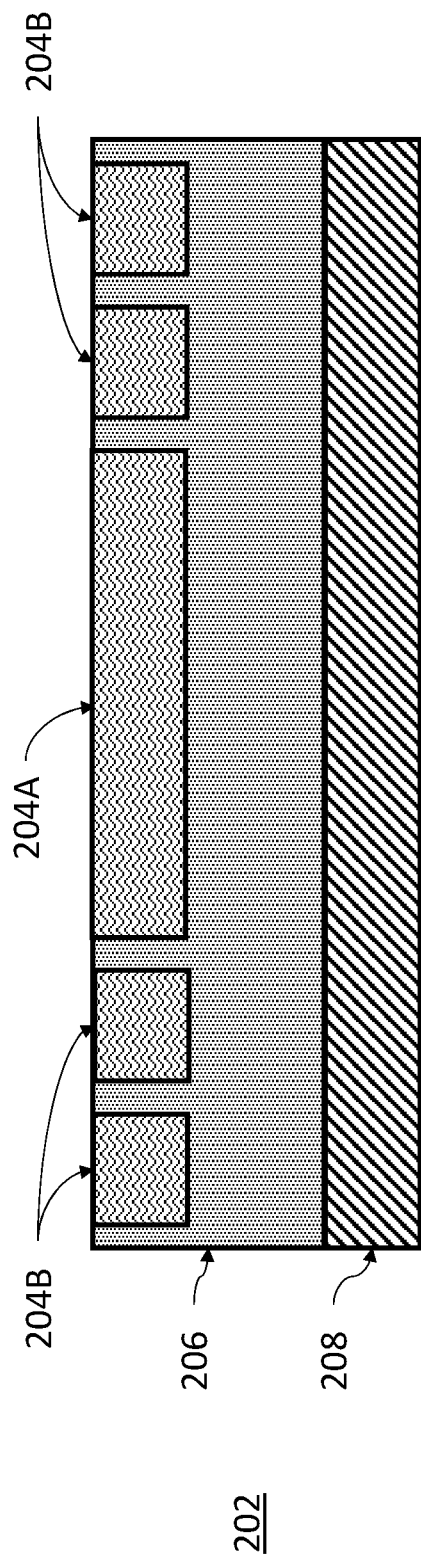

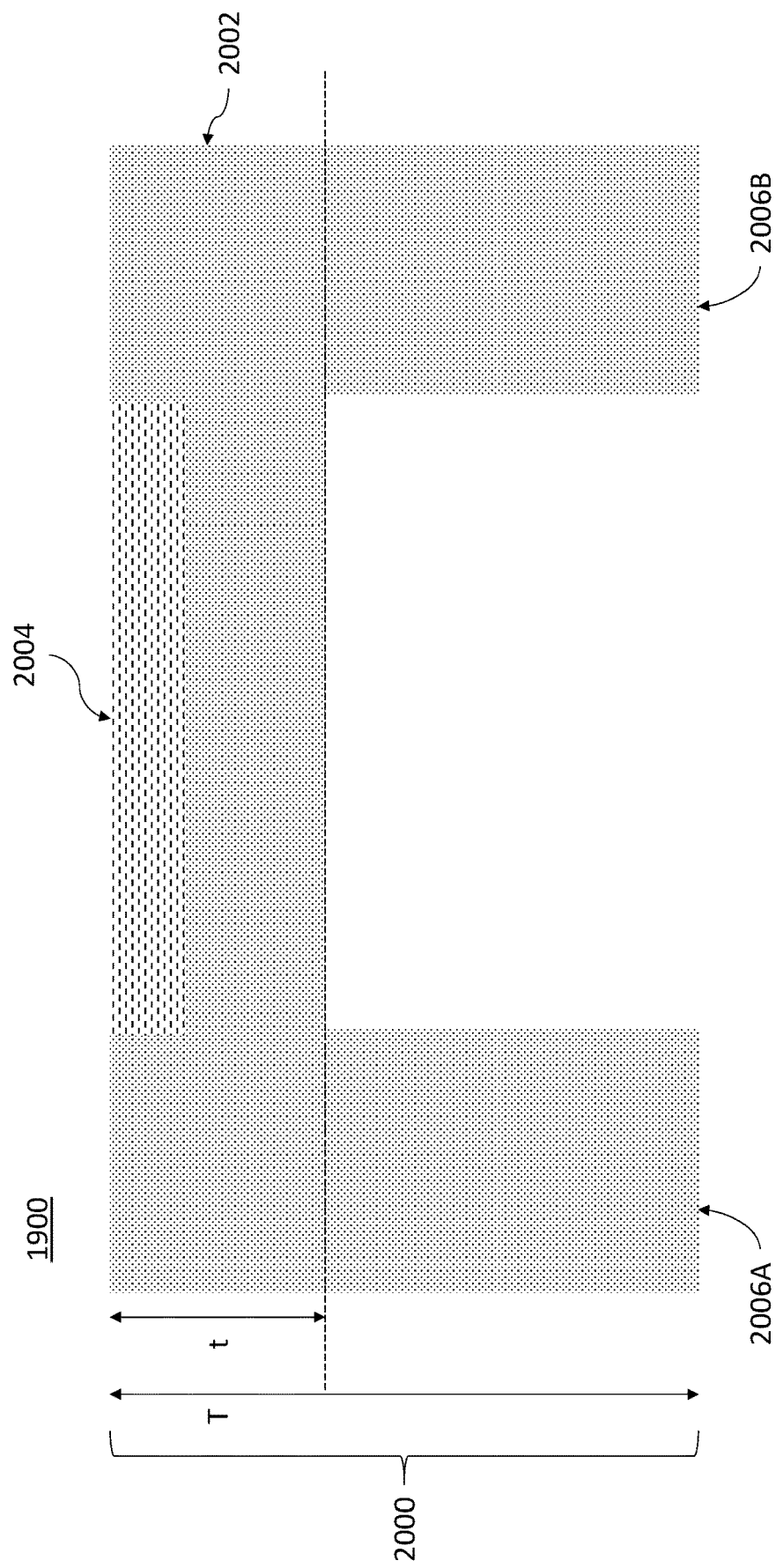

HETEROJUNCTION DEVICES AND METHODS FOR FABRICATING THE SAME

BACKGROUND

Field of the Invention

The present application relates generally to heterojunction devices and methods for fabricating the same.

Description of Related Art

In the world of semiconductors, Silicon (Si) is the most widely used. It properties lends itself to use in digital logic, memory, RF, power switching and optoelectronics. However, Si has fundamental limitations. For instance, in power switching applications, the operating voltage is limited by the electric field strength at which breakdowns occurs ($E_{br}$). $E_{br}$ is directly related to the bandgap of the material. Si has an $E_{br}$ of approximate 0.3 MV/cm, which limits its use in power switching applications. $\beta$-$Ga_2O_3$, however, has a larger bandgap of approximately 4.9 eV, and an $E_{br}$ of 8 MV/cm. This corresponds to a power figure of merit (using the Baliga figure of merit) of approximately 3,444 as compared to 1 for Si. While SiC and GaN offer higher bandgaps than Si, their respective power figures of merit are 160 and 870, far less than $\beta$-$Ga_2O_3$. However, $\beta$-$Ga_2O_3$ is not without limitations. As is typical of oxide semiconductors, it is unlikely that p-type doping can be achieved with effective hole conduction in $\beta$-$Ga_2O_3$. P-type regions, however, are required for power devices. Moreover, $\beta$-$Ga_2O_3$ also displays poor thermal conductivity. Thus, it would be desirable to have structures which could take advantage of $\beta$-$Ga_2O_3$ large $E_{br}$ while still being suitable for power devices.

SUMMARY OF THE INVENTION

One or more the above limitations may be diminished by structures and methods described herein.

In one embodiment, vertical current devices that include a substrate, an n-type material layer, a plurality of p-type gates, and a source are provided. The n-type material layer is disposed on the substrate and includes a current channel. A plurality of p-type gates are disposed on opposite sides of the current channel. A source is disposed on a distal side of the current channel with respect to the substrate. The n-type material layer comprises beta-gallium oxide.

BRIEF DESCRIPTION OF THE DRAWINGS

The teachings claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 2A is a cross-sectional view of a diode 200 that uses a heterojunction.

FIG. 2B is a cross-sectional view of a diode 202 that uses a heterojunction.

FIG. 13 is a cross-sectional view of a thinned structure 1900.

Figure 1A:
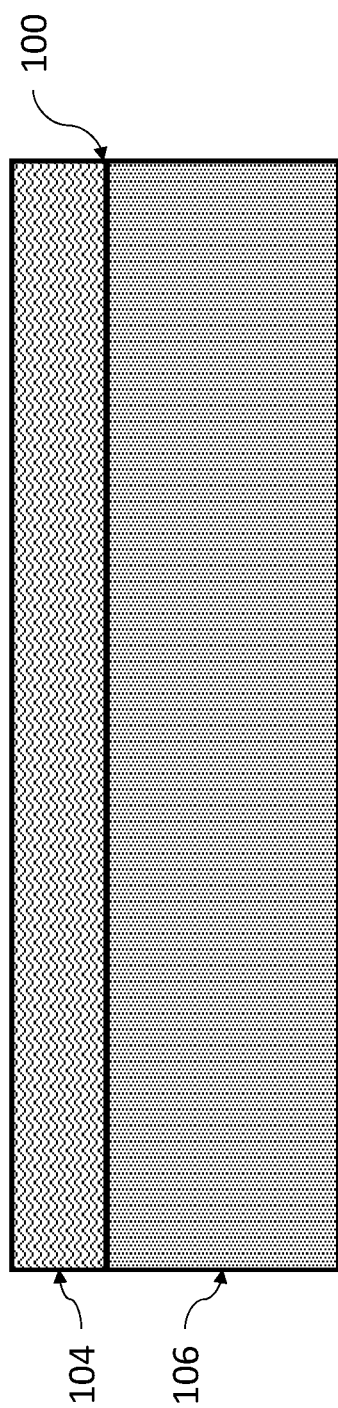
FIG. 1A is a cross-sectional view of a heterojunction.

Different ones of the Figures may have at least some reference numerals that are the same in order to identify the same components, although a detailed description of each such component may not be provided below with respect to each Figure.

DETAILED DESCRIPTION OF THE PREFERRED EMBODIMENTS

In accordance with example aspects described herein, current carrying devices and methods for their creation are described herein. To assist the reader, a brief overview is provided. First, a plurality of current carrying devices are discussed. Most of those devices are formed on a composite substrate of n+$Ga_2O_3$ beneath n− $Ga_2O_3$. The active region of these devices can generally be considered to include the n− $Ga_2O_3$ layer as well as layers and structures located within or on top of the $Ga_2O_3$ layer. A generalized method of forming the active regions of these devices is then described. One of ordinary skill in the art will appreciate that to produce of each of the devices described herein the generalized method must be adjusted for each device. Those adjustments are also described herein. However, for brevity, repetitive discussion of previously discussed elements is omitted. After the generalized method is discussed, attention is turned to methods for thinning the substrate on which the devices are formed, and exemplary embodiments of thinned substrates is provided. As a person of ordinary skill will appreciate, one or more of the devices discussed in FIGS. 2A-10 could be substantially formed in the active region area(s) of FIGS. 13-19. Finally, a preferred method for thinning a substrate and incorporating a current carrying device therein is described.

With the general overview set forth above, attention will now be turned to the current carrying devices illustrated in FIGS. 1A-10. As noted above, p-type β-Ga$_2$O$_3$ is likely unavailable. Thus, to take advantage of β-Ga$_2$O$_3$ benefits, a p-type heterojunction is disclosed and employed.

A heterojunction is a junction between two dissimilar crystalline semiconductors. FIG. 1A illustrates a heterojunction 100 between two semiconductor layers 104 and 106. In this example, layer 104 may be a p-type material, and layer 106 may be an n-type material. As one of ordinary skill will appreciate, the label "p-type" or "p+" indicates that the majority charge carrier in the material are holes and electrons are the minority charge carrier. The designation "n–type" indicates the opposite, namely that electrons are the majority charge carrier and holes are the minority charge carrier. Below, the terms "n–" and "n+" are used. The term "n+" indicates that the material has a larger number of available charge carriers (in this case electrons) than a material with the designation "n–".

Figure 1B:
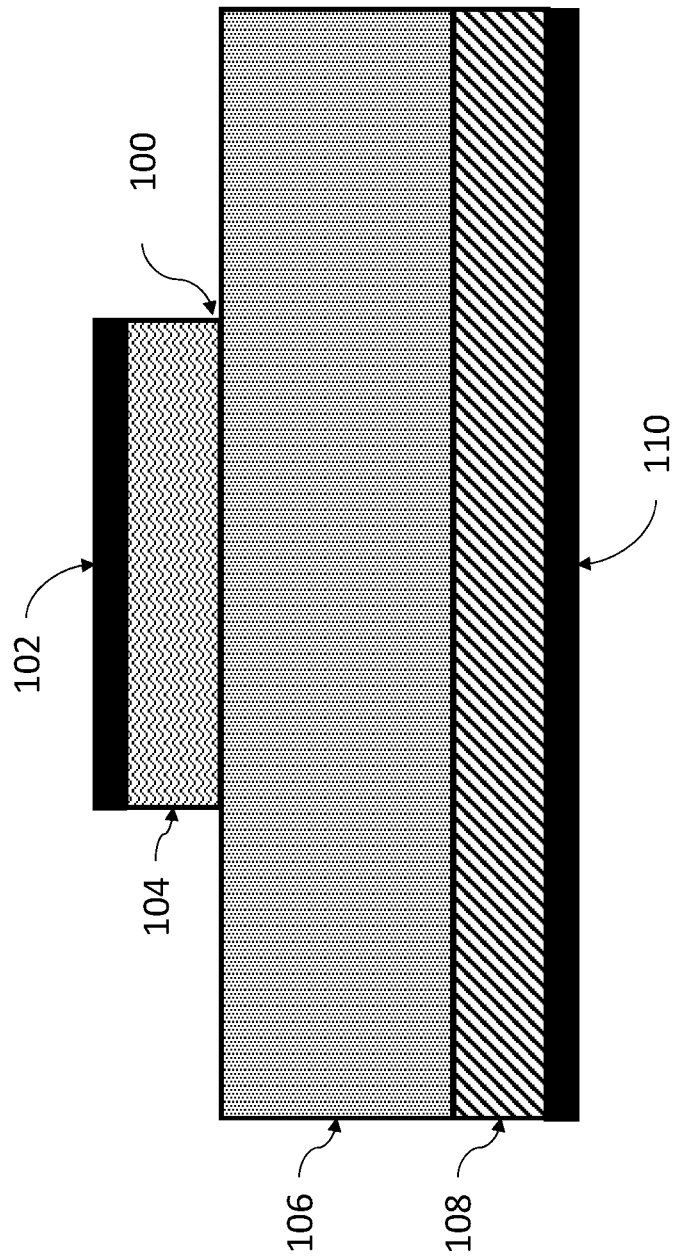
FIG. 1B is a cross-sectional view of a heterojunction with additional elements.

FIG. 1B is a cross-sectional view of an exemplary structure that includes p+ material 104, n– material 106, and n+ material 108. Like in FIG. 1A, a heterojunction 100 exists between the p+ material 104 and the n– material 106. Attached to the p+ material 104 is an anode contact 102, and attached to the n+ material 108 is a cathode contact 110. In one embodiment, contacts 102 and 110 comprises Ti/Au, Au, or Pt/Au, although other metals may be used.

Numerous examples of power switches and other devices are described below that make use of p+, n–, and n+ materials/layers, along with other materials/layers. For convenience, suitable materials for the various layers/components will be addressed immediately below. Unless otherwise stated, the following materials may be used for the p+, n–, and n+ materials/layers discussed in this disclosure, respectively.

The p+ materials/layers may comprise, for example: a p-type diamond material layer, a p-type III-nitride material layer, a p-type metal oxide material layer, a p-type metal-iodide layer, a p-type III-V material layer, a p-type group IV material layer, a p-type nickel oxide layer, a p-type copper oxide layer, a p-type vanadium oxide layer, a p-type molybdenum oxide, a p-type tungsten oxide, a p-type copper iodide layer, a p-type silicon layer, a p-type germanium layer, a p-type polycrystalline diamond, a p-type nanocrystalline diamond, a p-type crystalline III-nitride, a p-type polysilicon, a p-type polycrystalline semiconductor material, a p-type crystalline semiconductor material, a p-type epitaxial material, a p-type epitaxial semiconductor material, a p-type highly oriented material, a p-type wide bandgap polycrystalline semiconductor material, a p-type wide bandgap crystalline semiconductor material, a p-type wide bandgap epitaxial material, a p-type wideband gap highly-oriented material layer, a p-type metal oxide material layer, or a p-type metal nitride layer.

In some embodiments, the thickness of the P-type layer may be 100 nm. In some embodiments, the thickness of the P-type layer may be about 200 nm. In some embodiments, the thickness of the P-type layer may be about 400 nm. In some embodiments, the thickness of the P-type layer may be about 600 nm. In some embodiments, the thickness of the P-type layer may be about 1000 nm. In some embodiments, the thickness of the P-type layer may be about 200 nm. In some embodiments, the thickness of the p-type layer may be about 3000 nm.

In some embodiments the P-type doping concentration in the P-type layer may be about $1\times10^{15}$ cm$^{-3}$. In some embodiments, the P-type doping concentration in the P-type layer may be in the range from about $1\times10^{15}$ cm$^{-3}$ to $1\times10^{16}$ cm$^{-3}$. In some embodiments, the P-type doping concentration in the P-type layer may be in the range from about $1\times10^{15}$ cm$^{-3}$ to $1\times10^{16}$ cm$^{-3}$. In some embodiments, the P-type doping concentration in the P-type layer may be in the range from about $1\times10^{15}$ cm$^{-3}$ to $1\times10^{16}$ cm$^{-3}$. In some embodiments, the P-type doping concentration in the P-type layer may be in the range from about $1\times10^{15}$ cm$^{-3}$ to $1\times10^{16}$ cm$^{-3}$. In some embodiments, the P-type doping concentration in the P-type layer may be in the range from about $1\times10^{16}$ cm$^{-3}$ to $1\times10^{17}$ cm$^{-3}$. In some embodiments, the P-type doping concentration in the P-type layer may be in the range from about $1\times10^{17}$ cm$^{-3}$ to $1\times10^{18}$ cm$^{-3}$. In some embodiments, the P-type doping concentration in the P-type layer may be in the range from about $1\times10^{18}$ cm$^{-3}$ to $1\times10^{19}$ cm$^{-3}$. In some embodiments, the P-type doping concentration in the P-type layer may be in the range from about $1\times10^{19}$ cm$^{-3}$ to $1\times10^{20}$ cm$^{-3}$. In some embodiments, the P-type doping concentration in the P-type layer may be in the range from about $1\times10^{20}$ cm$^{-3}$ to $1\times10^{21}$ cm$^{-3}$.

In some embodiments, the product of the thickness of the P-type layer and the P-type doping concentration may be in the range of about $1\times10^{12}$ cm$^{-2}$ to about $1\times10^{13}$ cm$^{-2}$. In some embodiments, the product of the thickness of the P-type layer and the P-type doping concentration may be in the range of about $1\times10^{13}$ cm$^{-2}$ to about $1\times10^{14}$ cm$^{-2}$. In some embodiments, the product of the thickness of the P-type layer and the P-type doping concentration may be in the range of about $1\times10^{14}$ cm$^{-2}$ to about $1\times10^{15}$ cm$^{-2}$. In some embodiments, the product of the thickness of the P-type layer and the P-type doping concentration may be greater than about $1\times10^{13}$ cm$^{-2}$. In some embodiments, the product of the thickness of the P-type layer and the P-type doping concentration may be greater than about $2\times10^{13}$ cm$^{-2}$. In some embodiments, the product of the thickness of the P-type layer and the P-type doping concentration may be greater than about $4\times10^{13}$ cm$^{-2}$. In some embodiments, the product of the thickness of the P-type layer and the P-type doping concentration may be greater than about $6\times10^{13}$ cm$^{-2}$. In some embodiments, the product of the thickness of the P-type layer and the P-type doping concentration may be greater than about $8\times10^{13}$ cm$^{-2}$. In some embodiments, the product of the thickness of the P-type layer and the P-type doping concentration may be greater than about $1\times10^{14}$ cm$^{-2}$. The product of the thickness of the P-type doping and the P-type doping concentration is important to allow an electric field to deplete into the P-type material but have reduced electric field or no electric field when it reaches the top surface of the P-type material or reaches a metal layer that is to top surface of the P-type material to reduce leakage current or breakdown current that can be generated at the top surface of the P-type layer.

Other p-type materials may also be used. Preferably, such materials are wideband gap materials, with a bandgap greater than 2.0 eV. As discussed above, wide bandgap materials have a higher $E_{br}$. Since the peak of the electric field for a heterojunction (e.g., heterojunction 100) is often near the interface of the two materials, it is desirable for the p-type material to have a high $E_{br}$. Thus, in one embodiment, the p-type material is a material with a bandgap greater than 2.0 eV. The peak electric field is also dependent on the dielectric constant of the material. Peak electric field strength decreases with an increase in dielectric constant. Thus, in one embodiment, the dielectric constant of the p-type material may be greater than 5.0.

The p-type material may be deposited by various methods including, for example: physical vapor deposition, sputtering, ion beam assisted deposition, atomic layer deposition, chemical vapor deposition, vapor conversion, plasma chemical vapor deposition, and hit filament chemical vapor deposition. Several exemplary p-type materials, their properties, and exemplary deposition methods will now be described.

In one embodiment, the p-type material is diamond which has a bandgap of 5.5 eV and an $E_{br}$ of 10 MV/cm. The thermal conductivity of diamond ranges from 1000 W/mK to 2500 W/mK, and has a dielectric constant of ~5.7. Diamond may be deposited by chemical vapor deposition (CVD) to form the p-type material layer. In that case, the diamond will typically be nanocrystalline or polycrystalline. As illustrated and described below, a nanocrystalline diamond nucleation layer may be deposited on a surface (e.g., n-type material 106) prior to growing the diamond layer 104 by CVD.

In another embodiment, the p-type material is gallium nitride (GaN) which has a bandgap of 3.4 eV and an $E_{br}$ of 150 W/mk to 250 W/mk. The p-type gallium nitride material may be formed by using dopants such as magnesium dopants. Gallium nitride has a dielectric constant of ~8.9. The gallium nitride material may be epitaxially grown on $Ga_2O_3$.

In yet another embodiment, the p-type material is nickel oxide (NiO). Nickel oxide can have a bandgap of more than 5.0 eV. Nickel oxide may be deposited by sputter deposition.

Still in a further embodiment, the p-type material can be Copper oxide, also known as cuprous oxide, which has a bandgap greater than 2.0 eV. Copper oxide may be formed by oxidizing a thin copper film.

In a still further embodiment, the p-type material may be Cuprous Iodide (CuI) generated by exposing a thin Cu film in to iodine vapor.

A combination of different p-type materials may also be used for a structure. For example, as described below, p-type materials are used for both shields and gates. One type of p-type material may be used for a gate, while another type of p-type material may be used for the shield.

Having described suitable p-type materials for use with the devices described herein, suitable n-type materials will now be discussed. In a preferred embodiment, the n-type material is $Ga_2O_3$, most preferably β-$Ga_2O_3$. β-$Ga_2O_3$ may be used as a substrate with another β-$Ga_2O_3$ layer epitaxially grown thereon. In that case, the epitaxial layer may be an "n–" layer and the substrate may be a more heavily doped an "n+" layer. For example, layer 106 may be epitaxial n– β-$Ga_2O_3$ grown on an n+ β-$Ga_2O_3$ substrate 108. β-$Ga_2O_3$ has a bandgap of 4.8-4.9 eV and a high $E_{br}$ of about 8 MV/cm. These properties of β-$Ga_2O_3$ make it a preferred n-type material.

In some embodiments, a high temperature wide bandgap first dielectric layer may be included in a device. The high temperature first dielectric layer may include aluminum oxide, hafnium oxide, or zirconium oxide, as well as other materials with equivalent characteristics.

In some embodiments, a heterojunction nucleation layer may be included in a device. The heterojunction nucleation layer may be a nanocrystalline heterojunction film or a crystalline heterojunction film. Methods of deposing the nucleation layer will be described in detail below.

Finally, as discussed above with respect to FIG. 1B, metal contacts may be provided on a certain layers of the structures described herein. Those contacts may comprise Ti/Au, Au, or Pt/Au, although other metals may be used. With the materials for use in the devices and structures having been described, the devices and structures themselves will now be described.

FIGS. 2A and 2B are cross-sectional views of exemplary diodes that include a heterojunction. FIG. 2A is a cross-sectional view of a diode 200. Diode 200 includes an n– material layer 206, and n+ material layer 208, a p-type material layer 204A, and a p-type material 204B which acts as a junction termination. The p– material, n– material, and n+ material may be one of the materials discussed above. In a preferred embodiment, layers 206 and 208 are β-$Ga_2O_3$. Layers 204A and 208 may be connected to metal contacts (omitted for simplicity) comprising one of the materials described above.

FIG. 2B is a cross-sectional view of another diode 202 that uses a heterojunction. FIG. 2B is substantially similar to FIG. 2A, with the exception that layers 204A and 204B are formed within layer 206. This may be done by first depositing layer 206 and then etching certain portions of layer 206 to form recesses. Layers 204A and 204B may then be deposited to fill those recesses. Any excess material falling outside those recesses may then be removed through, for example, etching.

Figure 3A:
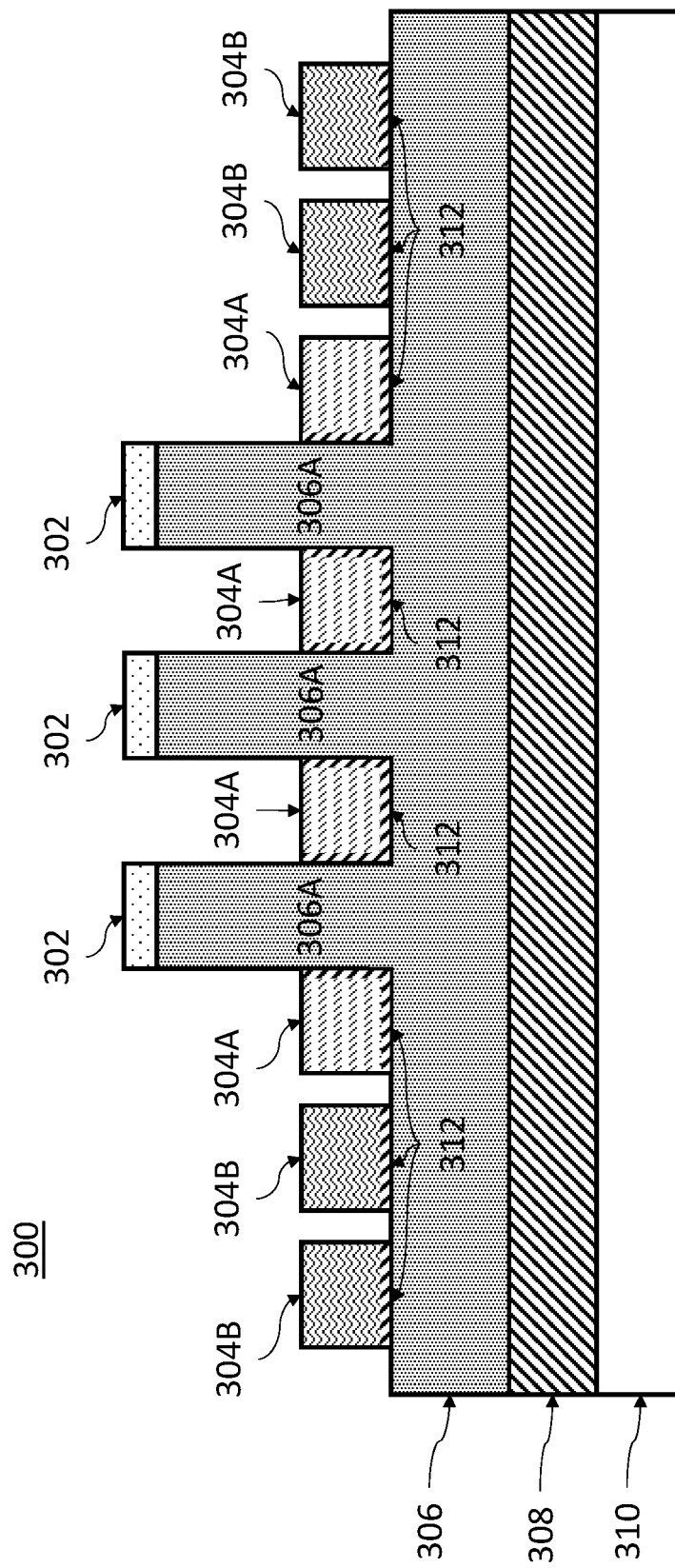
FIG. 3A is a cross-sectional view of a vertical junction field effect transistor (VJFET) 300.

FIG. 3A is a cross-sectional view of a β-$Ga_2O_3$ vertical junction field effect transistor ("VJFET") 300. Starting from the bottom of FIG. 3A, a plated copper layer 310 is provided. The plated copper layer 310 may be directly bonded to the n+β-$Ga_2O_3$ layer 308. This provides thermal conductivity between layers 308 and 310. On top of the n+ β-$Ga_2O_3$ layer 308, is an n– β-$Ga_2O_3$ layer 306. Above layer 306 are: a plurality of p+ heterojunction gates 304A and p+ floating terminations 304B. Gates 304A and terminations 304B may be formed by depositing p+ material on layer 306, and then etching away excess material to separate the gates 304A from each other and the terminations 304B. Alternatively, if 304A and 304B are different materials, one material may be deposited and its excess removed followed by the same process for the other material. Between gates 304A are current conducting channels 306A. Channels 306A may be formed of n– β-$Ga_2O_3$ grow epitaxially on layer 306 in regions where the p+ material was etched away. On top of the current conducting channels 306A are n+ sources 302. In one embodiment, a thickness of layer 306 (as measured between gates 304A and layer 308) is approximately 30 microns. Though, as described below, the overall thickness of device 300 may be within range with a lower end of 2 microns. In one embodiment, an optional nucleation layer 312 is also provided.

The p+ heterojunction floating terminations 304B may be one of the p+ materials described above. In one embodiment, the p+ heterojunction gates 304A may be one of the materials described above and also: polycrystalline diamond, nanocrystalline diamond, crystalline III-nitrides, epitaxial III-nitride, polycrystalline III-nitride, polysilicon, a polycrystalline semiconductor material layer, a crystalline semiconductor material layer, an epitaxial material layer, an epitaxial semiconductor material layer, a highly oriented material layer, a metal oxide material layer, a wide bandgap polycrystalline semiconductor material layer, a wide bandgap crystalline semiconductor material layer, a wide bandgap epitaxial material layer, a wide bandgap highly oriented material layer, a wide bandgap metal oxide material layer. Both terminations 304B and gates 304A may be deposited by the same methods described above for depositing p-type material. Gates 304A may also include a metal layer which can be used to lower the resistance of the heterojunction gates 304A.

VJFET 300 acts as a switch allowing current to flow from sources 302 to the plater copper layer 310. VJFET 300 may operate in normally-on and quasi-normally off modes. In the case of a quasi-off mode, where no bias is applied to the p-type heterojunction gates 304A, the current conducting channels 306A do not allow current to flow from the sources 302 to the plated copper layer 310. This is because the n− material forming channels 306A must be biased in order to allow electrons therein to be available in the conduction band and thus be available as charge carriers. When the p-type heterojunction gates 304A are positively, or forward, biased charge carriers in the n− material forming the current conducting channels 306A enter the conduction band and allow current to flow from sources 302 to plated copper layer 310. In contrast, when gates 304A are reversed biased relative to the source 302, channels 306A may be depleted of charge carriers and thus channels 306A will serve to block the flow of current from sources 302 to the copper layer 310. If the gates 304A are then forward biased relative to the sources 302, the channels 306A will become replete with charge carriers and thus form a channel that allows current to flow once again. One of the benefits of gates 304A, is that they protect the β-Ga$_2$O$_3$ layer 306 (and channels 306A) from high electric fields and acts as an electric field shield.

Figure 3B:
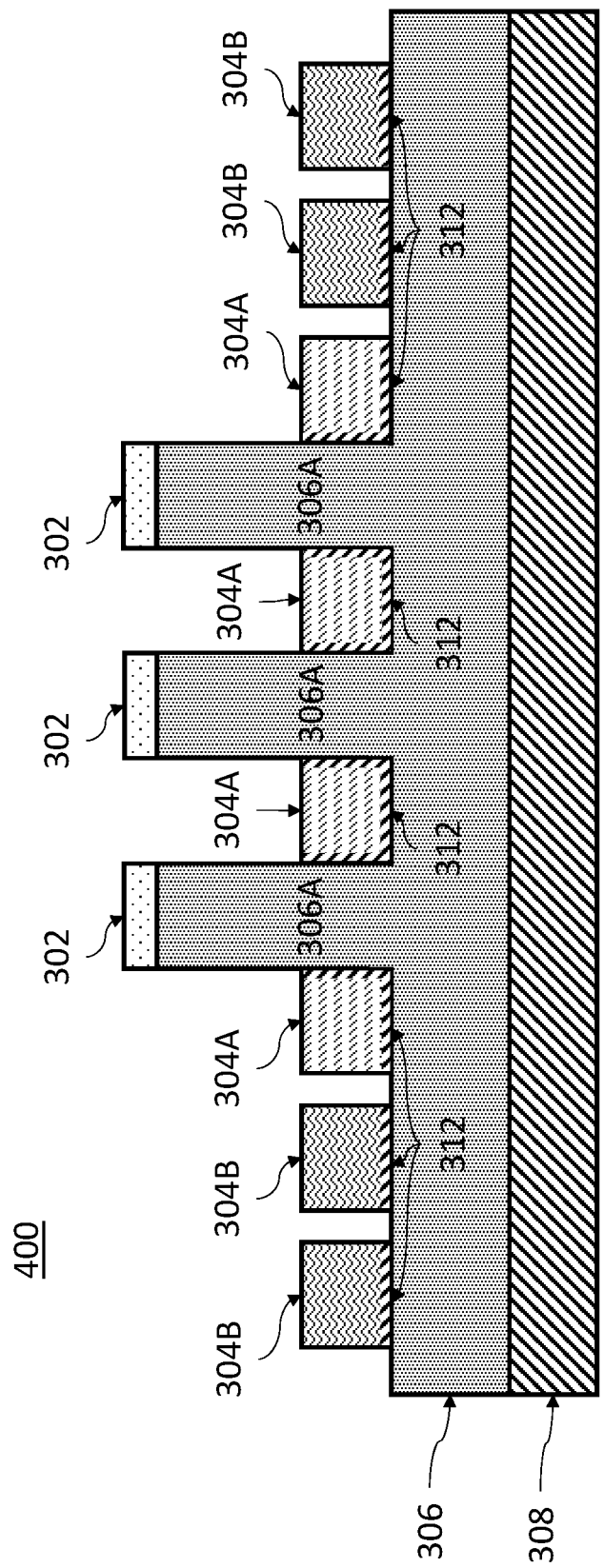
FIG. 3B is a cross-sectional view of another VJFET 400.

FIG. 3B is a cross-sectional view of another VJFET 400. VJFET 400 is substantially the same as VJFET 300, except the plated copper layer 310 is not provided. For brevity, descriptions of elements within FIG. 3B that have already been discussed with respect to FIG. 3A are omitted here, but may be found in the above description of FIG. 3A. In this embodiment, a drain contact (not shown) may be electrically coupled to the β-Ga$_2$O$_3$ layer 308. In this embodiment, to facilitate thermal conductivity between layers 306 and 308, direct wafer bonding of layers 306 and 308 is provided.

Figure 3C:
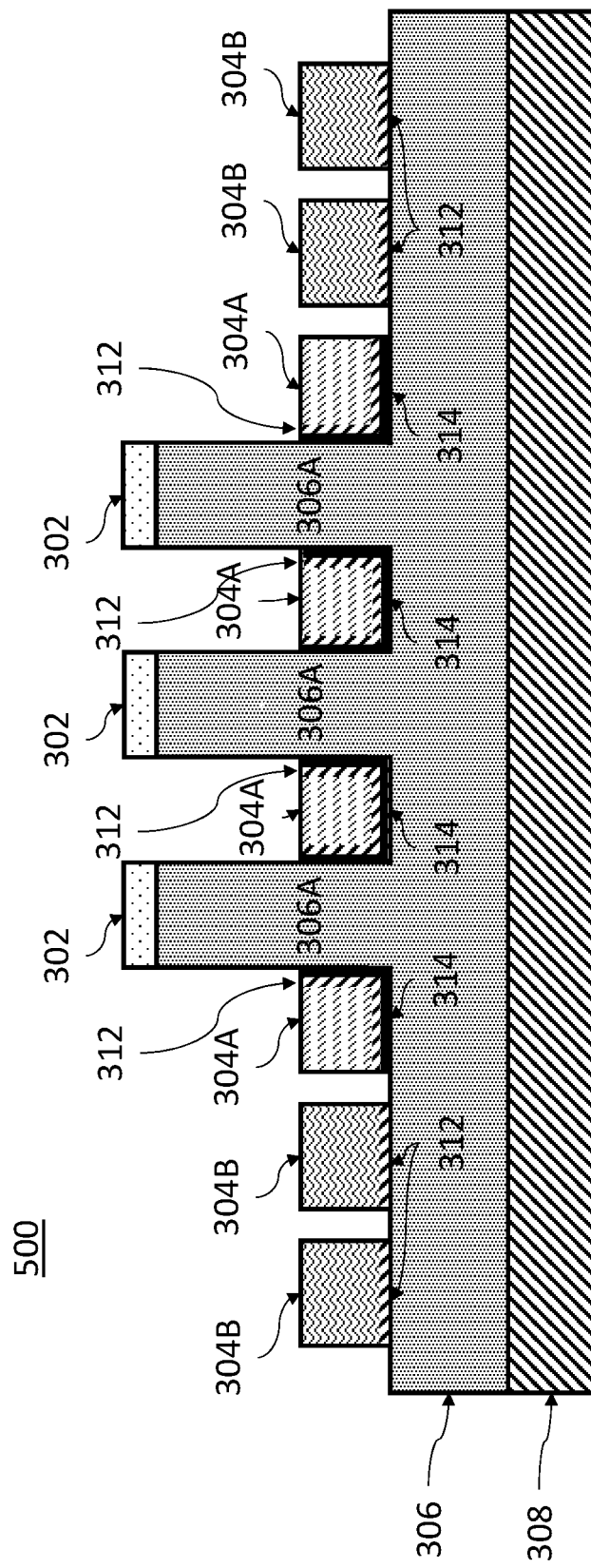
FIG. 3C is a cross-sectional view of another VJFET 500.

FIG. 3C is a cross-sectional view of another VJFET 500. VJFET 500 is substantially the same as VJFET 400, except a high temperature wide bandgap oxide 314 is provided. Like with FIG. 3B, for brevity, descriptions of elements within FIG. 3C that have already been discussed is omitted here, but may be found in the above discussion. The wideband gap oxide 314 is located, in one embodiment, between the optional nucleation layer 312 and layer 306 & channel 306A. The high temperature wideband gap oxide 314 may be one of the materials described above.

Figure 3D:
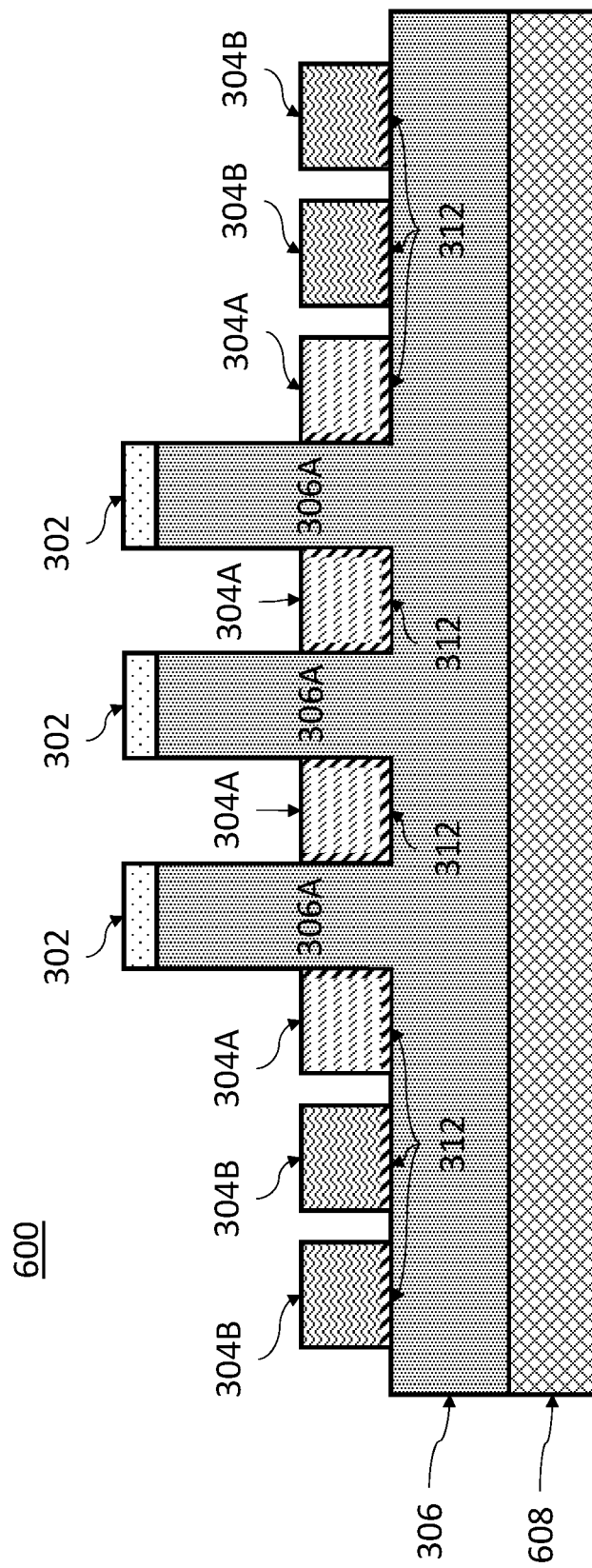
FIG. 3D is a cross-sectional view of another VJFET 600.

FIG. 3D is a cross-sectional view of another VJFET 600. VJFET 600 is substantially the same as VJFET 400, except that the β-Ga$_2$O$_3$ layer 308 has been replaced by an n+ type SiC layer 608. Like with the figures described above, for brevity, descriptions of elements within FIG. 3D that have already been discussed are omitted here, but may be found in the above discussion. A wafer bonded interface (not shown) may also be provided between layers 306 and 608 in FIG. 3D.

Figure 4:
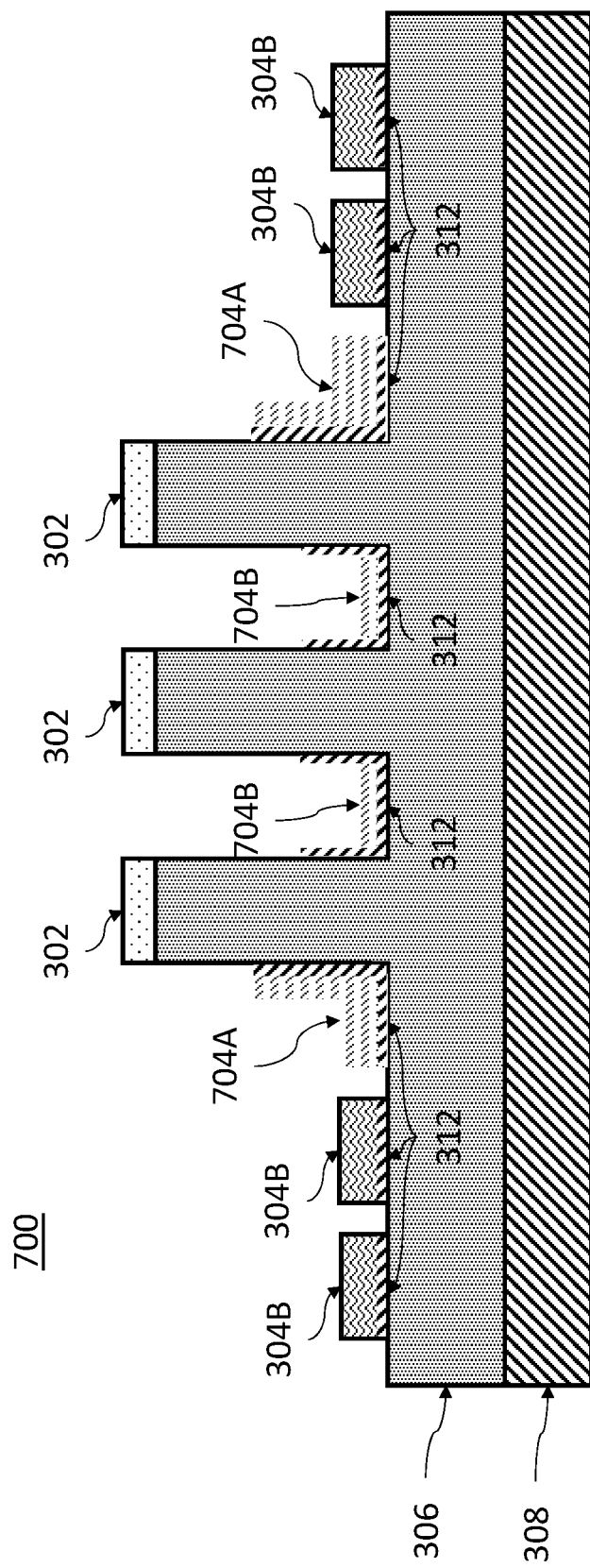
FIG. 4 is a cross-sectional view of another VJFET 700.

FIG. 4 is a cross-sectional view of another VJFET 700. VJFET 700 is substantially the same as VJFET 400 (shown in FIG. 3B), except that gates 704B are thinner than gates 304A. Like with the figures described above, for brevity, descriptions of elements within FIG. 4 that have already been discussed are omitted here, but may be found in the above discussion. In addition, gates 704A are L-shaped as opposed to rectangular like gates 304A. The L-shaped gates 704A may be formed by depositing the p-type gate material and then etching away the undesired material to form the L-shaped profile.

Figure 5:
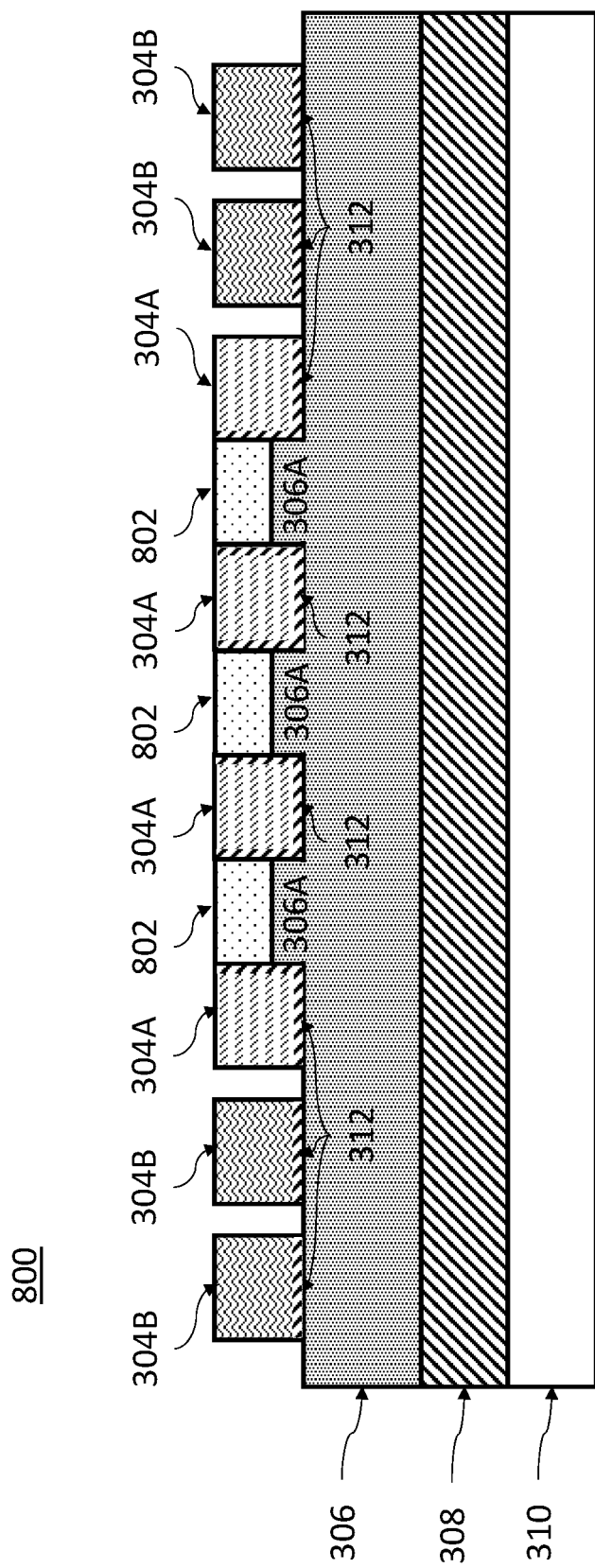
FIG. 5 is a cross-sectional view of another VJFET 800.

FIG. 5 is a cross-sectional view of another VJFET 800. VJFET 800 is substantially the same as VJFET 300 (shown in FIG. 3A), except channels 306A have been reduced in height such that the height of channels 306A and sources 802 together are approximately equal to the height of gates 304A. Like with the figures described above, for brevity, descriptions of elements within FIG. 5 that have already been discussed are omitted here, but may be found in the above discussion. Here, sources 802 may comprise the same materials as sources 302. The shortening in height of channels 306A may be accomplished in a series of steps. First, p-type material(s) for gates 304A and shields 304B is deposited, and then certain portions of that material are etched away to create recesses. Certain recesses may then be filled by epitaxially growing an n− β-Ga$_2$O$_3$ layer to serve as a conducting channels 306A within those recesses. A source material may then be deposited on top of channels 306A to serve as sources 802. Of course, as described above, contacts may be provided on sources 802 and the plated copper layer 310.

Figure 6:
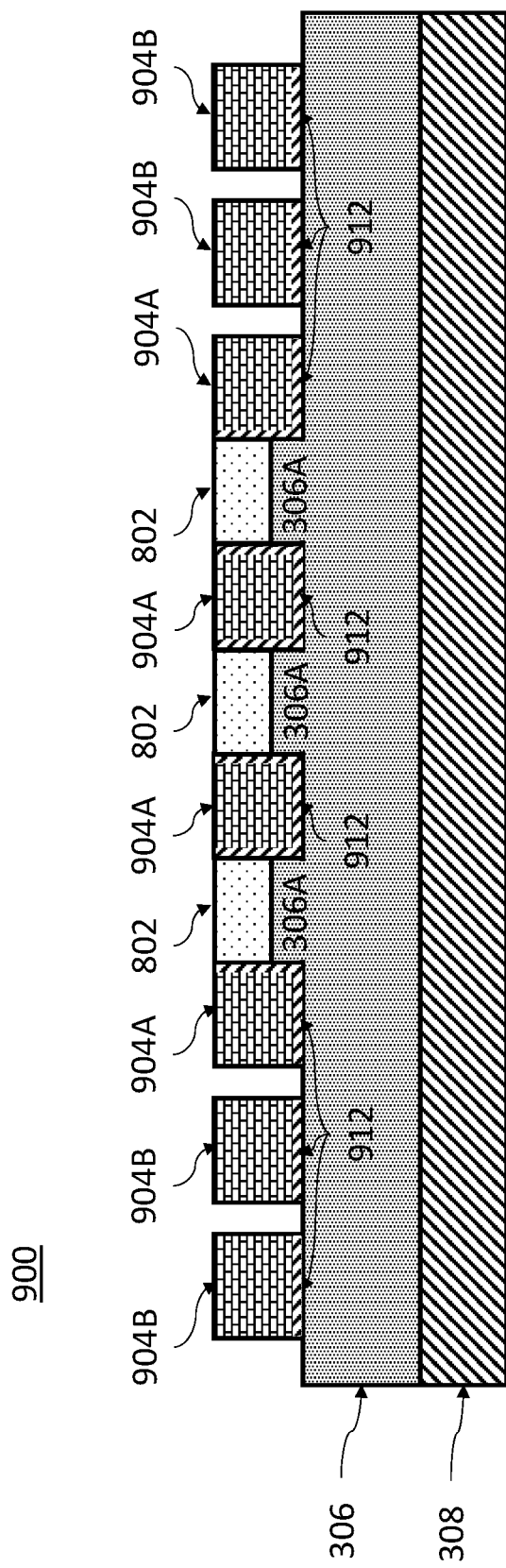
FIG. 6 is a cross-sectional view of another VJFET 900.

FIG. 6 is a cross-sectional view of another VJFET 900. VJFET 900 is substantially similar to VJFET 800, except that gates 904A, terminations 904B, and the nucleation layer 912 are formed by specific materials. Like with the figures described above, for brevity, descriptions of elements within FIG. 6 that have already been discussed are omitted here, but may be found in the above discussion. In FIG. 6, the gates 904A and the terminations 904B are formed by diamond. In addition, the nucleation layer 912 is a diamond nucleation layer.

Figure 7A:
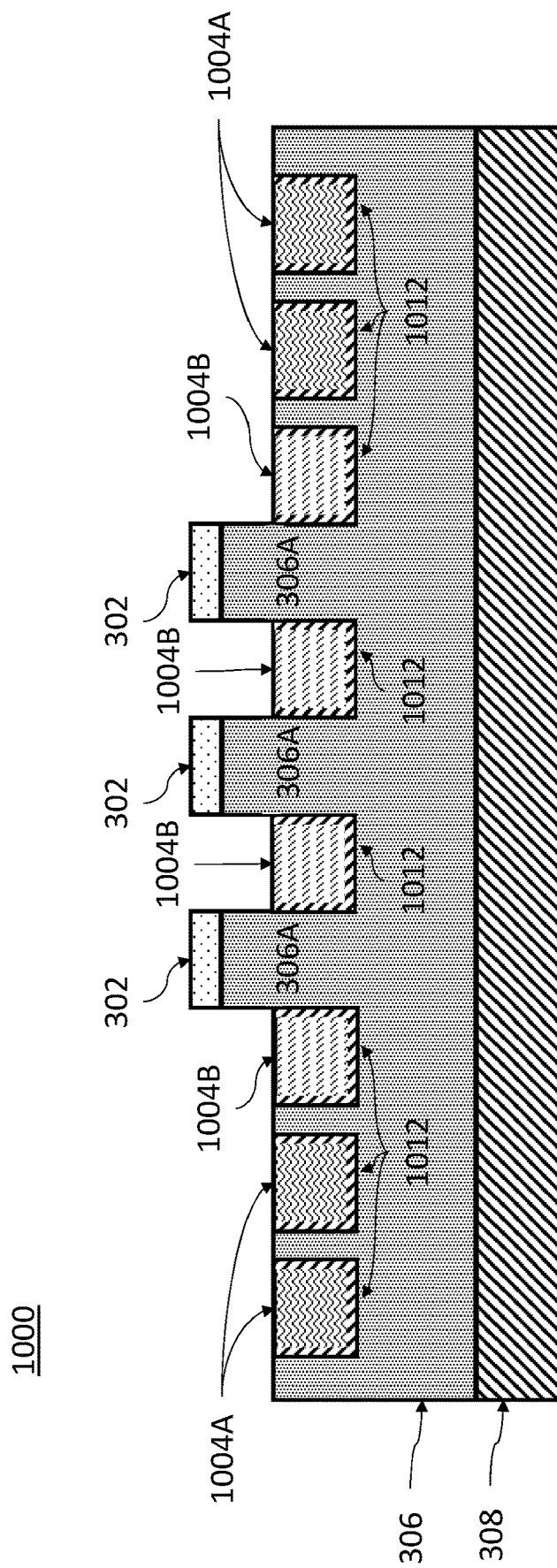
FIG. 7A is a cross-sectional view of another VJFET 1000.
Figure 7B:
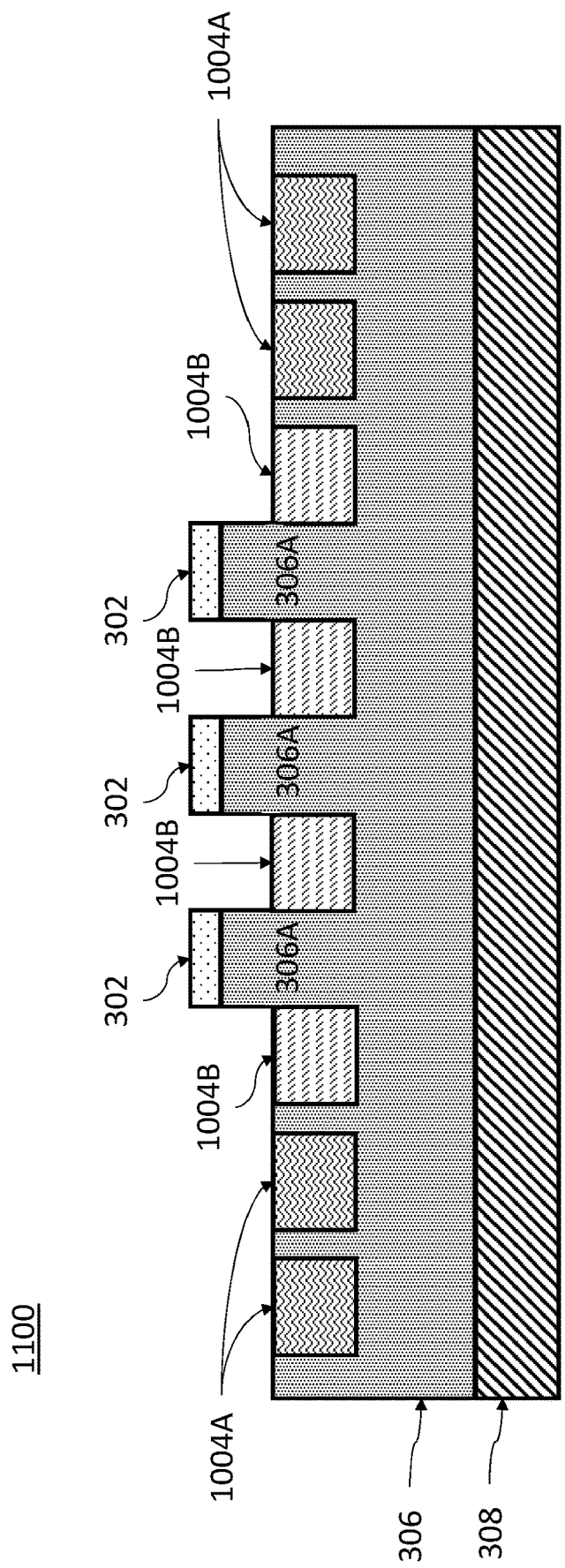
FIG. 7B is a cross-sectional view of another VJFET 1100.

FIG. 7A is a cross-sectional view of another VJFET 1000. VJFET 1000 is substantially similar to VJFET 400 (shown in FIG. 3B), except that terminations 1004A and gates 1004B are buried within β-Ga$_2$O$_3$ layer 306. Like with the figures described above, for brevity, descriptions of elements within FIGS. 7A and 7B that have already been discussed are omitted here, but may be found in the above discussion. Terminations 1004A and gates 1004B may be formed from one or more of the p-type materials discussed above. As a result of burying the terminations 1004A and gates 1004B, the optional nucleation layers 1012 now surround terminations 1004A and gates 1004B on three sides, so that the terminations 1004A and gates 1004B do not come into direct contact with β-Ga$_2$O$_3$ layer 306. Layer 1012 may formed from the same material as layer 312. Of course, nucleation layer 1012 is optional and can be omitted to form VJFET 1100, as shown in FIG. 7B.

Figure 7C:
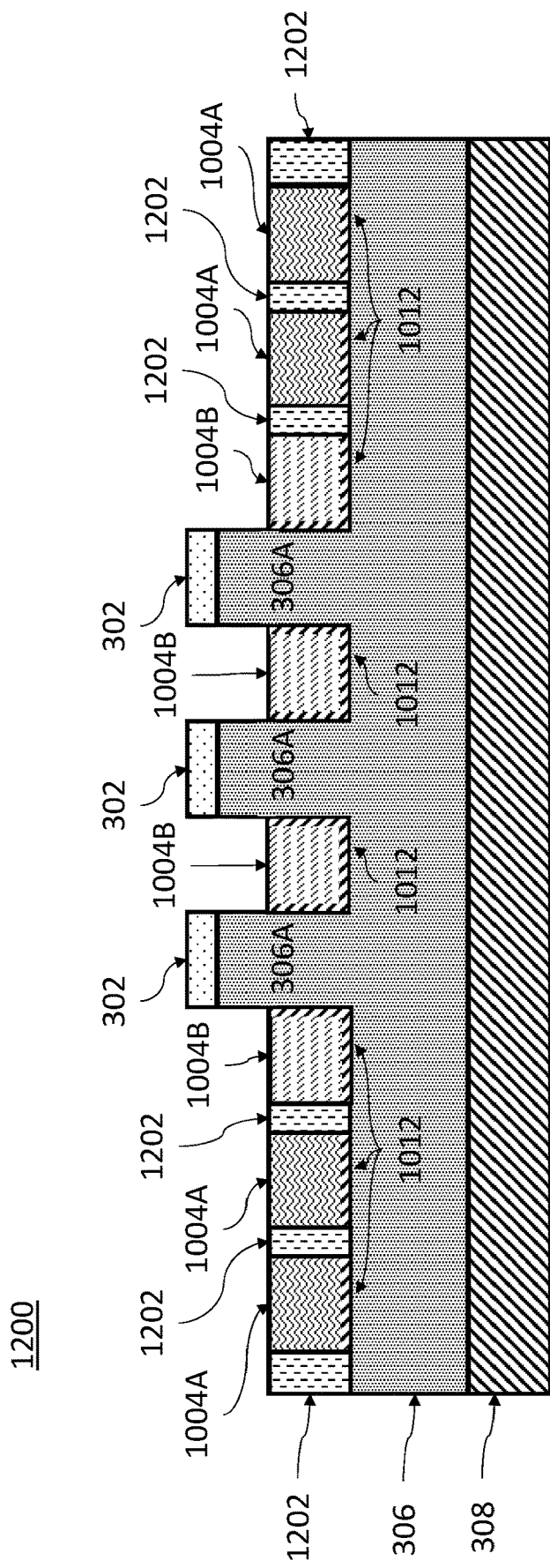
FIG. 7C is a cross-sectional view of another VJFET 1200.

FIG. 7C is a cross-sectional view of another VJFET 1200. VJFET 1200 is similar to VJFET 1000, except that ion implanted damaged isolation regions 1202 are provided adjacent to terminations 1004A and gates 1004B that are adjacent to channel 306A on one side. Like with the figures described above, for brevity, descriptions of elements within FIG. 7C that have already been discussed are omitted here, but may be found in the above discussion. Isolation regions 1202 may be formed by ion-implantation and serve to provide further electric field shielding.

Figure 8A:
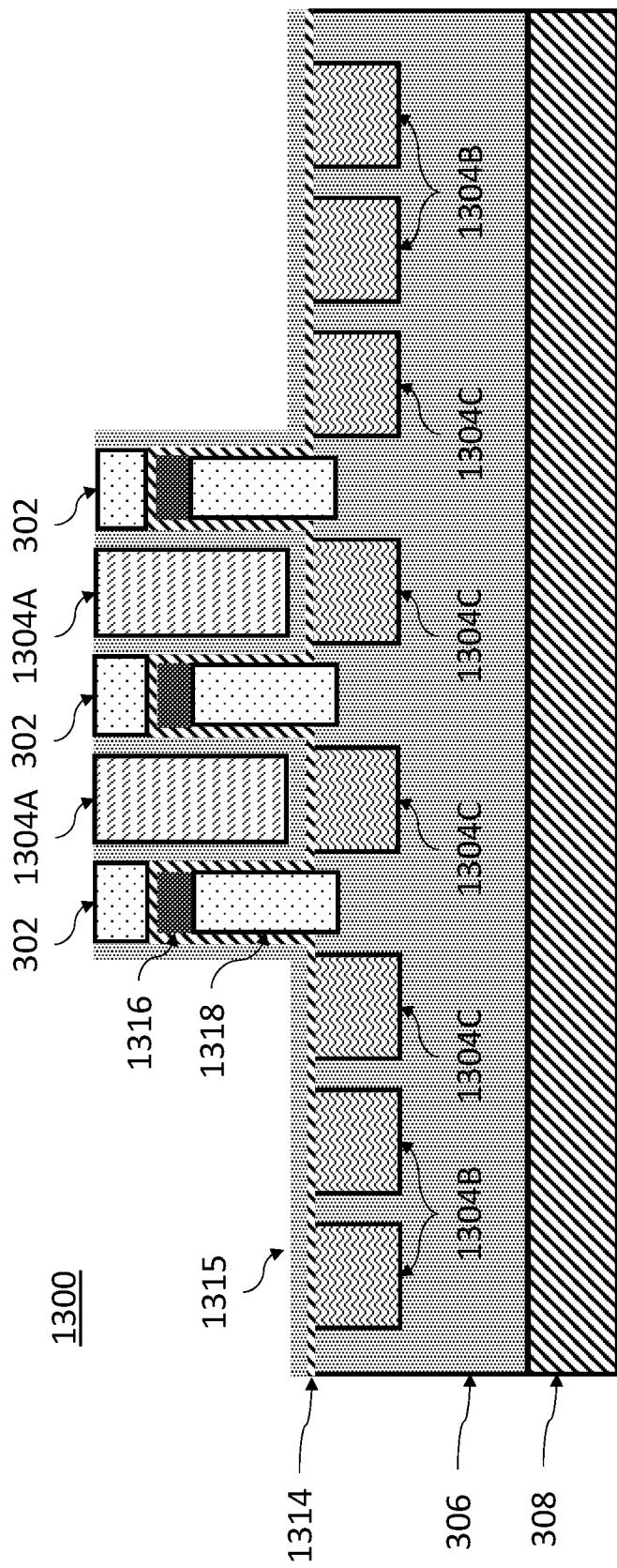
FIG. 8A is a cross-sectional view of a metal-oxide semiconductor field effect transistor (MOSFET) 1300.
Figure 8B:
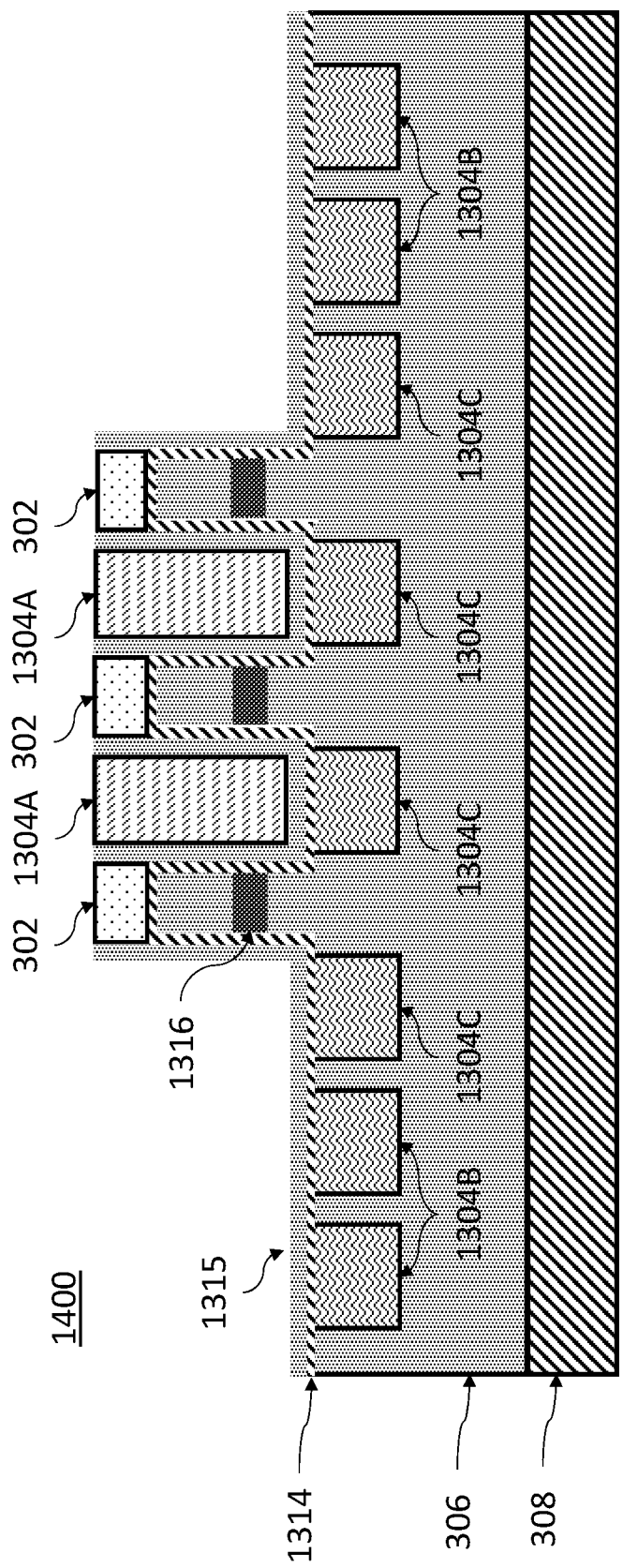
FIG. 8B is a cross-sectional view of another MOSFET 1400.

FIG. 8A is a cross-sectional view of a metal-oxide semiconductor field effect transistor (MOSFET) 1300. MOSFET 1300 includes an n+ β-Ga$_2$O$_3$ layer 308 and an n− β-Ga$_2$O$_3$ layer 306. Within the β-Ga$_2$O$_3$ layer 306 are a plurality of p-type heterojunction terminations 1304B and a plurality of floating p-type heterojunction shields 1304C. Above the terminations 1304B and shields 1304C is an n-type channel material 1314 that is used to conduct electrons from the source 302 into the N-type material layer 306. A gate dielectric layer 1315 is used between 1304A gate electrode and the n-type channel material 1314; outside of that region layer 1315 is a dielectric layer. In one embodiment, the n− material layer 1318 is n-type β-Ga$_2$O$_3$. An isolation region 1316 is located between the source 302 and the N-type 1318 material layer. The isolation region 1316 may be grown epitaxially or formed by ion implantation. The epitaxial channel material 1314 separates the isolation region 1316 from the source 302. The biasing of the gate electrode 1304A will modulate the current flow in the N-type channel material channel layer 1314 between the source 302 and the N-type 306. When the gate(s) 1304A are positively biased, a current channel is formed in the n− material layer 1314, allowing current to flow from the sources 302 to N-type 306 and then to a drain that is electrically connected to layer 308. In one embodiment, the isolation region 1316 can be moved vertically to be further away from source 302 then in FIG. 8A. FIG. 8B shows a MOSFET 1400 where the isolation region 1316 is located closer to the shields 1304C than the source 302.

Figure 8C:
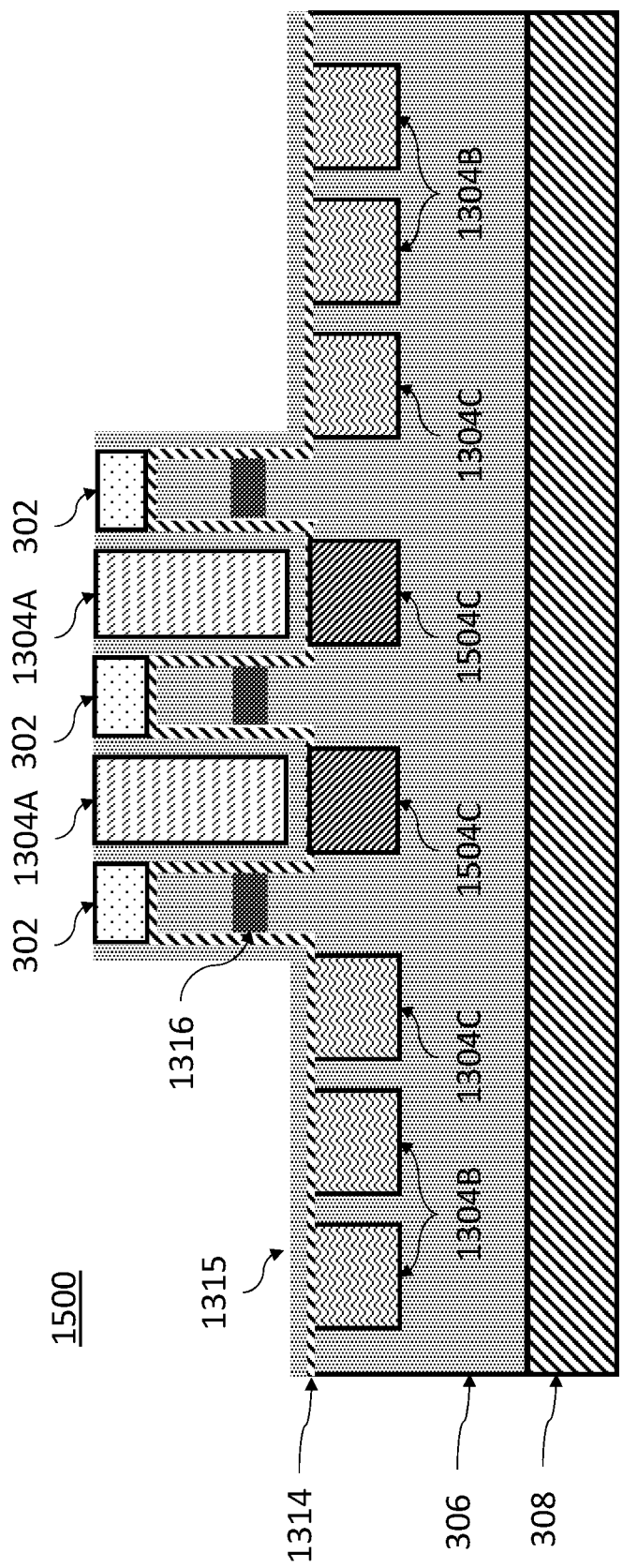
FIG. 8C is a cross-sectional view of another MOSFET 1500.

FIG. 8C is a cross-sectional view of another MOSFET 1500. MOSFET 1500 is substantially the same as MOSFET 1400, except it includes biased p-type heterojunction shields 1504C. Like with the figures described above, for brevity, descriptions of elements within FIG. 8C that have already been discussed are omitted here, but may be found in the above discussion.

Figure 8D:
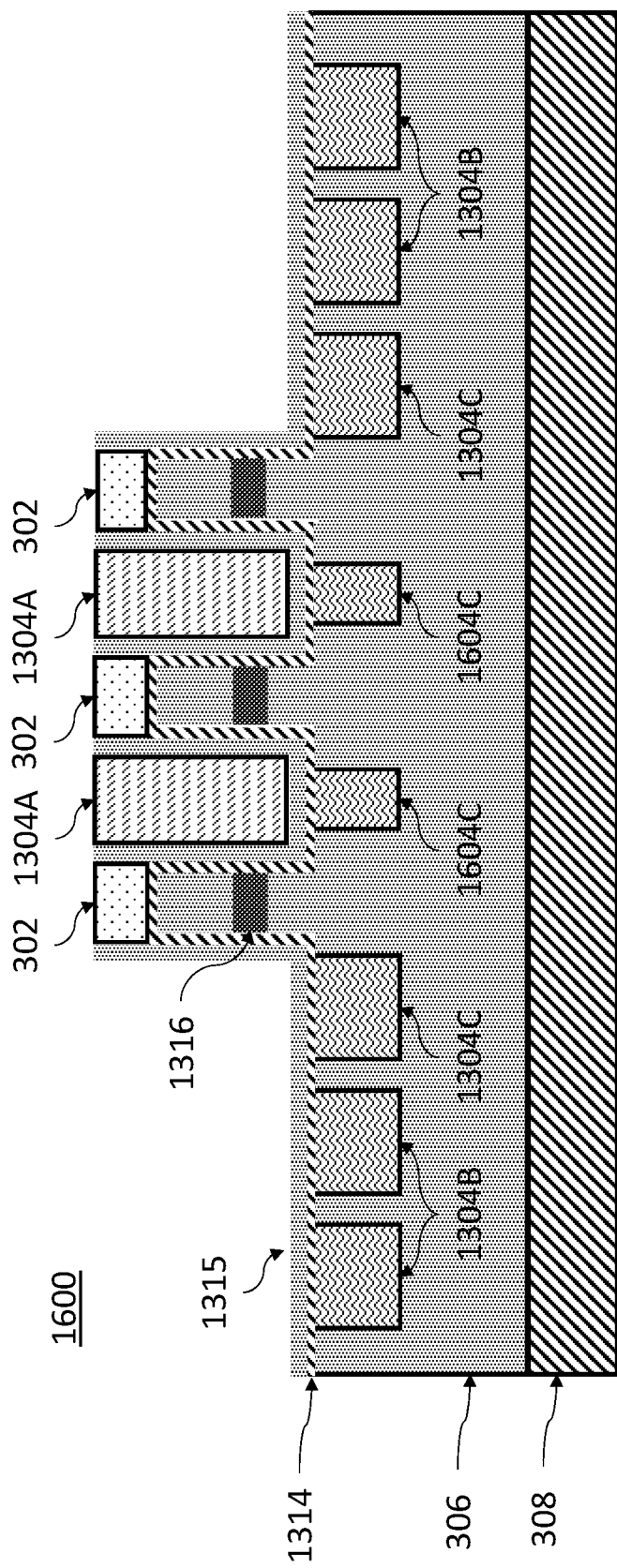
FIG. 8D is a cross-sectional view of another MOSFET 1600.

FIG. 8D is a cross-sectional view of another MOSFET 1600. MOSFET 1600 is substantially the same as MOSFET 1400, except the floating p-type heterojunction shields 1604C beneath gates 1304A are narrower in width than in MOSFET 1400 to allow a lower resistance to current flow through the N-type channel 3018 into N-type 306. The heterojunction shields 1604C can be about 100 nm to 700 nm smaller in dimension then the gate 1304A. Like with the figures described above, for brevity, descriptions of elements within FIG. 8D that have already been discussed are omitted here, but may be found in the above discussion.

Figure 9:
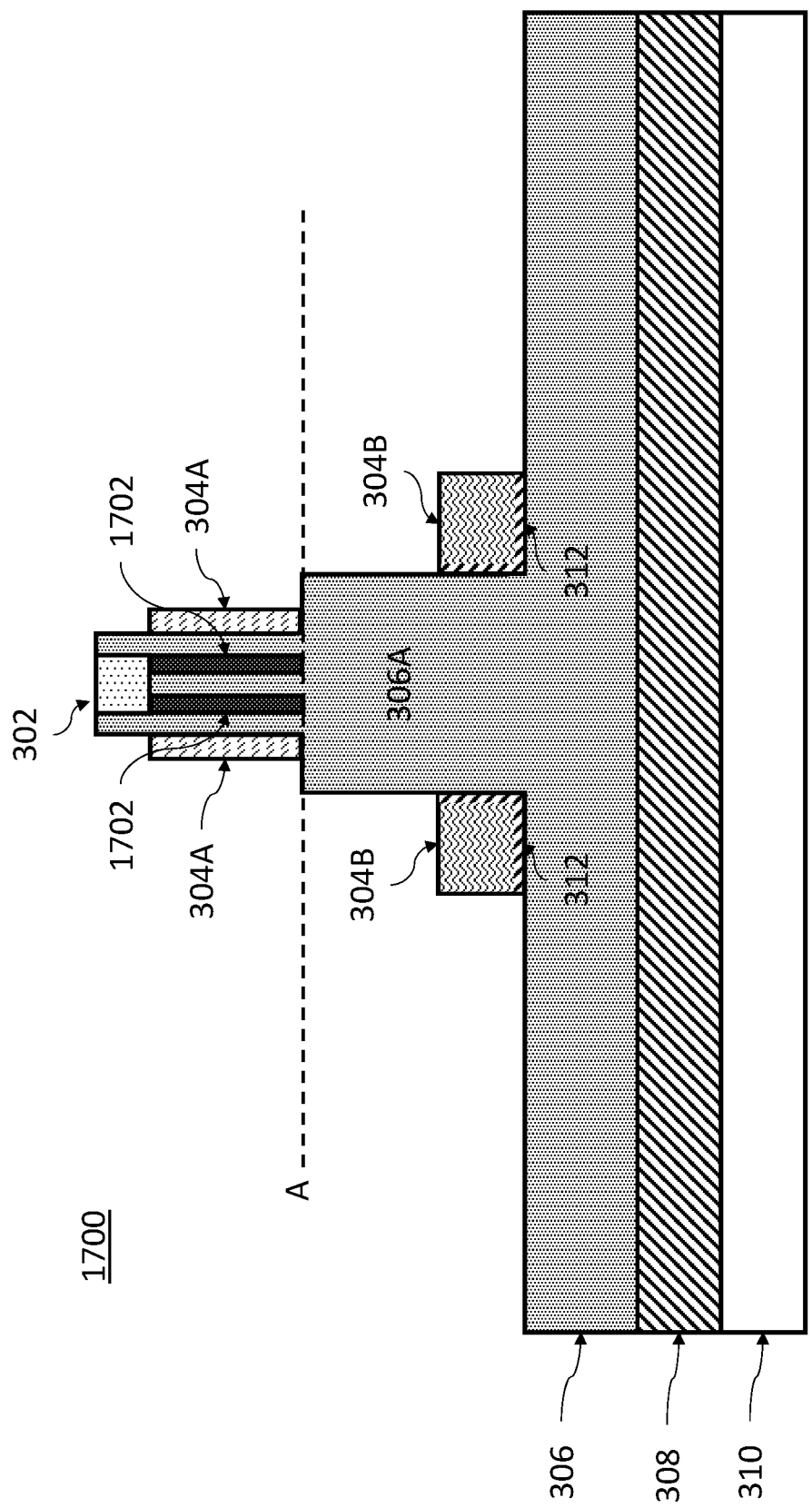
FIG. 9 is a cross-sectional view of a metal oxide semiconductor (MOS) gated vertical FET 1700.

FIG. 9 is a cross-sectional view of a metal oxide semiconductor (MOS) gated VFET 1700. Starting from the bottom of FIG. 9, a plated copper substrate 310 is provided. An n+ β-Ga$_2$O$_3$ layer 308 is provided on top of the plated copper 310. An n− β-Ga$_2$O$_3$ layer 306 is provided on top of the β-Ga$_2$O$_3$ layer 308. In one embodiment, the thickness of the β-Ga$_2$O$_3$ layer 308 is approximately 5 microns, and the thickness of the β-Ga$_2$O$_3$ layer 306 is approximately 30 microns. Layer 306 extends vertically to form a channel 306A. On either side of channel 306A, p+ heterojunction electric field shields 304B are provided. Between the shields 304B and channel 306A, an optional nucleation layer 312 may be provided. Channel 306A narrows at line A and becomes bordered by gates 304A on either side. At the top of channel 306A, a buried n+ material acting as a source 302 may be provided. When the gates 304A are forward biased, current conducting side channels 1702 are formed and allow current to flow from the source 302 to drain connected to the plated copper layer 310. Alternatively, in an embodiment where the plated copper layer 310 is not included, the current may flow to a drain that is electrically connected to layer 308.

Figure 10:
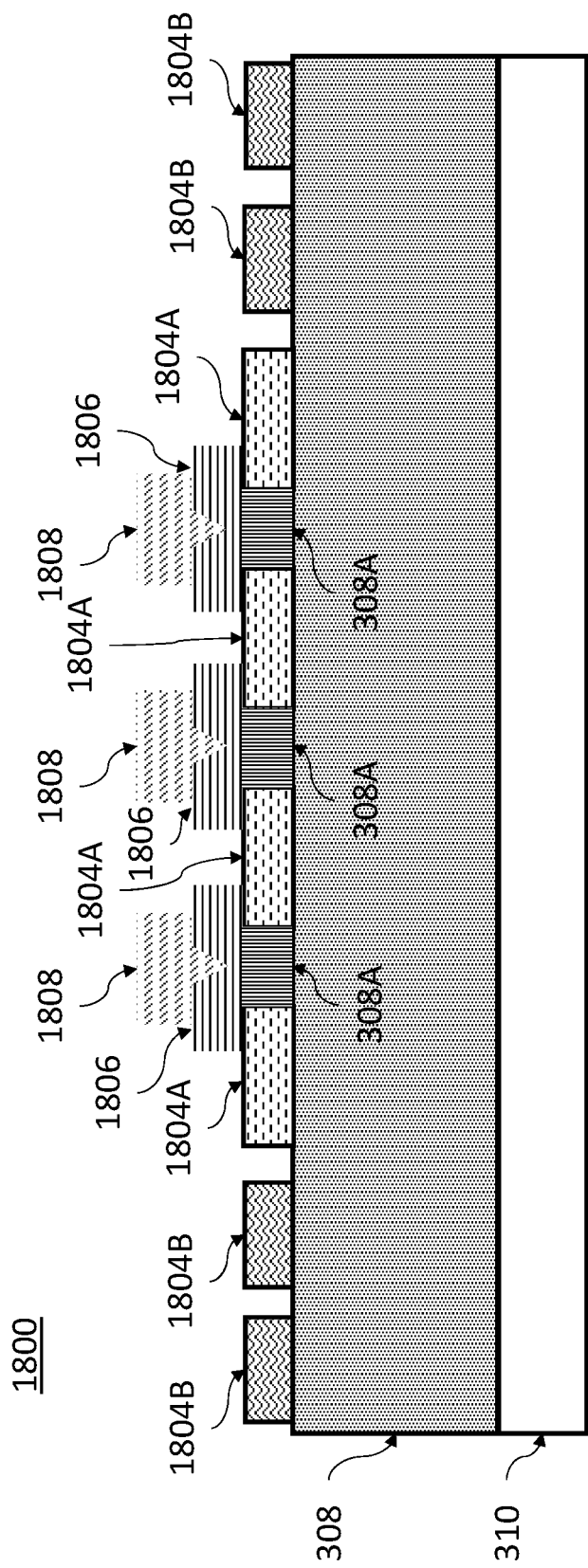
FIG. 10 is a cross-sectional view of VJFET 1800.

FIG. 10 is a cross-sectional view of VJFET 1800. Like FIG. 3A, a copper plated substrate 310 may be provided. An n+ β-Ga$_2$O$_3$ layer 308 may be provided on top of the copper plated substrate 310. In one embodiment, another n− β-Ga$_2$O$_3$ layer may be provided on top of β-Ga$_2$O$_3$ layer 308. On top of β-Ga$_2$O$_3$ layer 308 are: p+ floating junction terminations 1804B, p+ material layers 1804A, and n− current channels 308A. The floating p+ material (1804A and 1804B) spread out the electric field and change the effective radius of curvature of the electric field in the termination region to allow a higher breakdown voltage. Above layers 1804A and channels 308A, are n+ sources 1806. Above, the n+ sources 1806 are gates 1808. By forward biasing gates 1808, current may be allowed to flow from the sources 1806 through the current channels 308A to a drain (not shown) electrically connected to the plated copper substrate 310. In one embodiment, the material layers 1804A are formed of gallium nitride (GaN).

In each of the above devices and structures, a heterojunction of a p-type material and β-Ga$_2$O$_3$ is formed, and current is allowed to flow through β-Ga$_2$O$_3$ layer to a drain. These devices take advantage of the properties of β-Ga$_2$O$_3$ and thus provide, among other features, robust power switches capable of handling high electric fields with lower on resistance that Si devices simply could not.

Having described various embodiments and structures that make use of β-Ga$_2$O$_3$ as a substrate, methods of forming thinned substrates (such as β-Ga$_2$O$_3$) for use in such devices will be described below.

Figure 11:
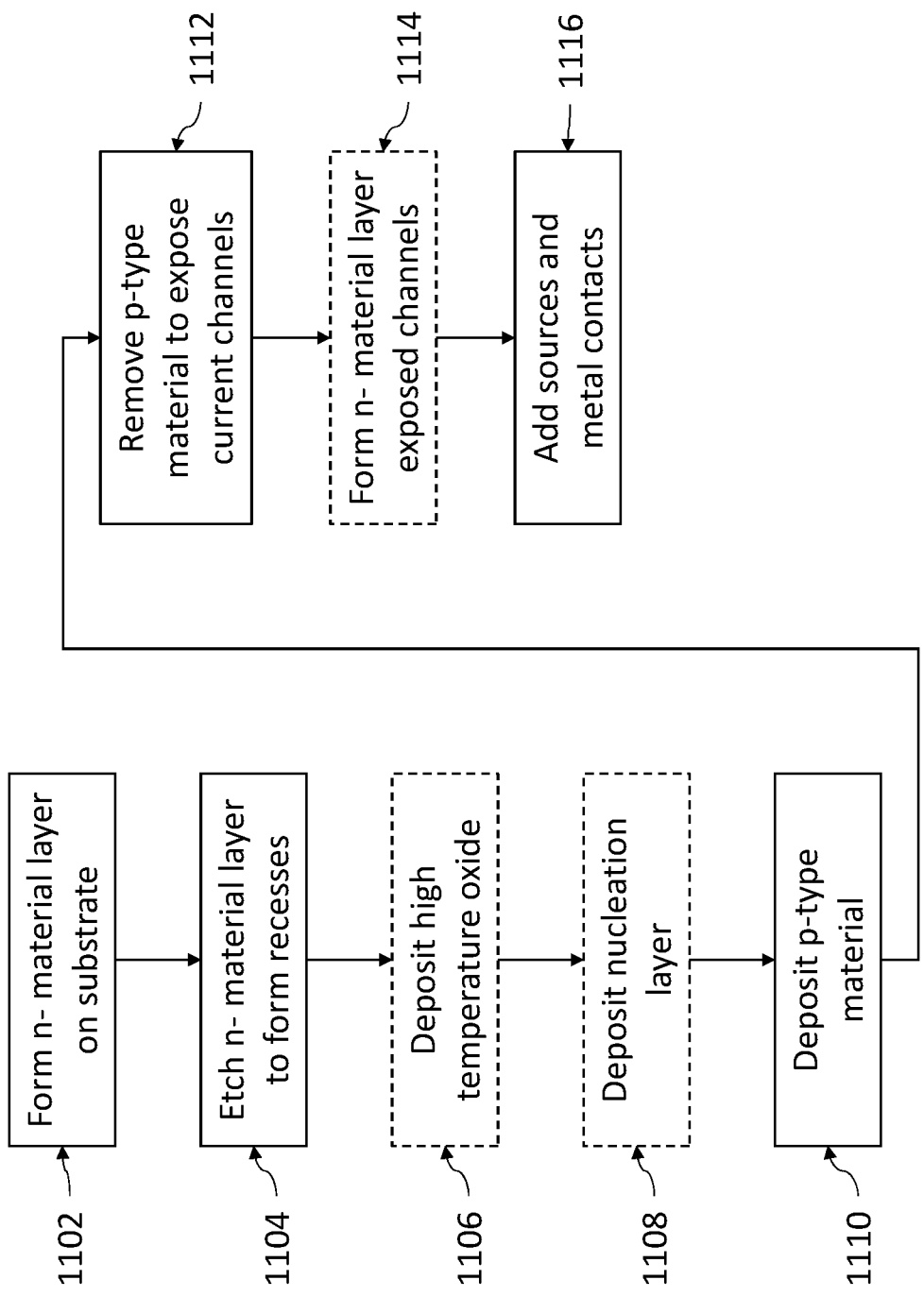
FIG. 11 illustrates a method of a forming a current conducting device.

FIG. 11 illustrates a generalized method of a forming a current conducting device, which may be slightly modified to form one of the devices/structures described above. In S1102, an n− material 306 is formed on an n+ substrate 308. This may be accomplished by hydride vapor phase epitaxy (HVPE), metal-organic chemical vapor deposition (MOCVD), molecular beam epitaxy (MBE), or atomic layer epitaxy. In a preferred embodiment, the n− material 306 and the n+ substrate 308 are doped versions of β-Ga$_2$O$_3$, as described above. The n+ substrate 308 may already be provided on a plated copper layer 310. Optionally, the top surface of the n− material 306 may be ion-implanted by an n-type dopant, and the n− material 306 annealed to activate the dopant. In step S1104, recess regions are etched into the n− material 306 to form recesses. Next, in S1106, a high temperature oxide 314 may, optionally, be deposited on top of the n− material 306 (see FIG. 3C). A nucleation layer 312 may then, optionally, be deposited (S1108). Next, in S1110, a p-type material may be deposited, either on top of the nucleation layer 312 and/or the high temperature oxide 314 or on top of the n− material 306. The p-type material is then etched, in S1112, to expose the n− material 306 and create gates 304A and terminations 304B. An n− material (preferably β-Ga$_2$O$_3$) is then, optionally, grown on top of the n− material 306 to form channels 306A (S114). Metal contacts, as described above, may then be applied in S1116 to the substrate (e.g., the plated copper layer 310 in FIG. 3A or the n+ material layer 308 in FIG. 3B).

As noted above, the method disclosed in FIG. 11 may be modified to produce structures shown in FIGS. 3B-7C. Those modifications are provided below, although some of these steps have already been described above. To produce the structure shown in FIG. 3B, the n+ substrate is simply not disposed on a plated copper layer 310. To produce the structure shown in FIG. 3C, the plated copper layer 310 is omitted and steps 1106 and 1108 are performed. To produce the structure shown in FIG. 3D, a SiC layer 608 is used as the substrate in S1102. To produce the structure shown in FIG. 4, the masking process (which is part of the etching process) is adjusted to produce an L-shaped profile. Moreover, the deposition time for the p-type material is adjusted to produce lower profile terminations 304B and gates 704A and 704B. To produce the structure shown in FIG. 5, the amount of n− material added in S1114 is limited so as to ensure that the height of the conducting channels 306A does not exceed the height of the gates 304A and terminations 304B. The n+ sources 802 may then be deposited on top of channels 306A to raise the channel/source structure 306A/802 to the height of the gates 304A and terminations 304B. Alternatively, step S1114 may be omitted, and the source material deposited directly on layer 306. To produce the structure shown in FIG. 6, diamond is used at the p-type material in S1110. To produce the structure shown in FIG. 7A, the masking process in step 1104 is adjusted to create additional recesses in layer 306, into which the terminations and gates may be formed. To produce the structure shown in FIG. 7B, step S1108 is omitted. To form the structure shown in FIG. 7C, an additional step of ion implantation is performed after the p-type material is added.

FIGS. 2A-10 focus on the active regions of the devices, that is layers 206/306 and above. While layers 206/306 play a part in the active region, they may also be considered to form part of a composite substrate that includes layer 308 and/or 310. It would be desirable to have current conducting devices (such as the one described above) where the total semiconductor thickness is small, in some instances as small as 2 microns. However, semiconductor wafers that are 2 microns thick are difficult to manufacture. Thus, a method for creating thin vertical current conducting devices by starting with relatively thick substrates is provided and discussed below.

Figure 12:
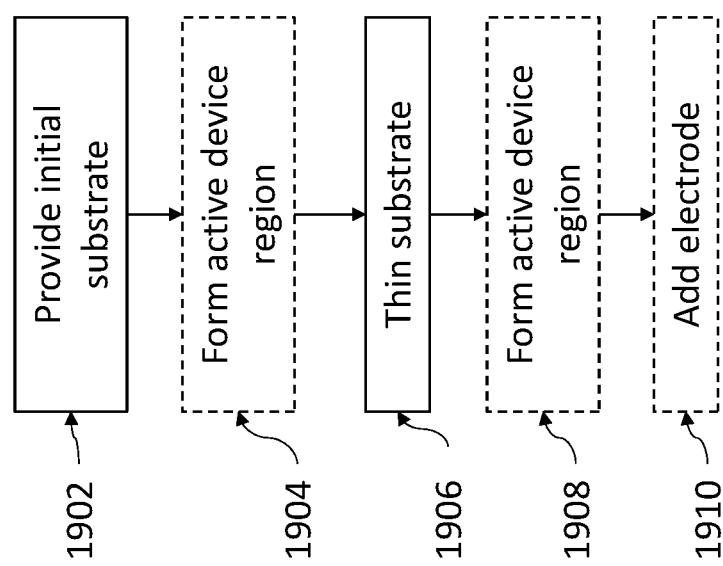
FIG. 12 illustrates a method of creating thin current conducting devices.

FIG. 12 shows a general method of creating thin current conducting devices. Initially, in S1902, a relatively thick semiconductor substrate with at least one conductivity type dopant (e.g., n+) is provided. The thickness of the substrate may be 30-1000 microns. Though this may be a single wafer substrate (e.g., layer 308 only), the substrate may also be a composite substrate that includes a wafer and an epitaxial layer located on one side of the wafer (e.g., layers 306 and 308). A composite substrate may comprise a semiconductor epitaxial layer grown on a semiconductor substrate or another semiconductor material layer that is wafer bonded to a substrate. The type of doping in the epitaxial layer may be the same type of doping in the substrate, but the amount of doping may differ (like layers 306 and 308). In one embodiment, the epitaxial layer may be an n-type doping while the doping in the substrate is insulating or semi-insulating.

Whether a single wafer substrate or a composite substrate, an active device region is formed in S1904. As noted above, the active device region may include structures located above layer 306 in FIGS. 2A-10. More generally, the active device region can be considered to be a conductivity region that implements a source for electron flow and includes a gate electrode. In a preferred embodiment, the gate electrode is field effect transistor (FET) gate electrode. In another embodiment, the active device region can include a FET structure, a heterojunction PN junction, a PN junction, or a Schottky junction.

Next, in S1906, the substrate is thinned from a second side, opposite the side of the substrate in which the active device region is formed and below the active device region, to form a thinned region. The thinned region can have a thickness from 2-400 microns. In the case where a composite substrate is used, the thinned regions may be form such that (i) some of the wafer substrate remains, or (ii) none of the wafer substrate remains, as the thinning has proceeded all the way through the wafer substrate. The thinned region can be formed in S1906 by several methods, including etching or laser drilling. Different types of etching may be used, including: reactive ion etching (RIE), chemical etching, isotropic chemical etching, anisotropic chemical etching, plasma etching, anisotropic plasma etching, and isotropic plasma etching.

In one embodiment, instead of forming the active device region in S1904, prior to thinning in S1906, the active device region may be formed in S1908 after the thinning in S1906. Next, a current conducting electrode, preferably an ohmic contact electrode, is formed on the second side of the substrate (S1910) in contact with the surface of the thinned region or in contact with a conductivity type dopant in the thinned region. Metal plating or solder can be used to facilitate extension of the current conducting and thermal conducting electrode to the second side.

The thinned regions may be thought of as trenches, and the areas chosen for thinning may be selected so as to align the trenches with the active device regions on the first side of the substrate. When more than one active device regions are on the first side of the substrate, the trenches can be aligned (by selecting certain areas for thinning) to the active device regions to leave regions, or ribs, of support on the second side located between each pair of active device regions on the first side. The thinned regions can be formed in a contiguous pattern or in a non-contiguous pattern such as a checkerboard pattern (see FIG. 20) to provide increased substrate mechanical strength.

Having described a general method for producing thinned current conducting devices, the devices themselves will be shown and described. Unlike FIGS. 2A-10 (which focus on the active device region) these figures will focus on how the substrate (including a composite substrate) is modified.

FIG. 13 is a cross-sectional view of a thinned structure 1900. Structure 1900 was formed by thinning a substrate 2000 from a second side (at the bottom of FIG. 13) to produce a thinned region 2002 and ribs 2006A and 2006B. An active device region 2004 is formed on a first side of the substrate 2000. As described above, the initial overall thickness (T) of the substrate 2000 may range from 30-1000 microns (in a preferred embodiment the range is 20-200 microns), and the thickness (t) of the thinned region may range from 2-100 microns. The substrate 2000 may be a single wafer substrate or a composite substrate, as described above. In one embodiment, the substrate 2000 is made of silicon or $Ga_2O_3$.

Figure 14A:
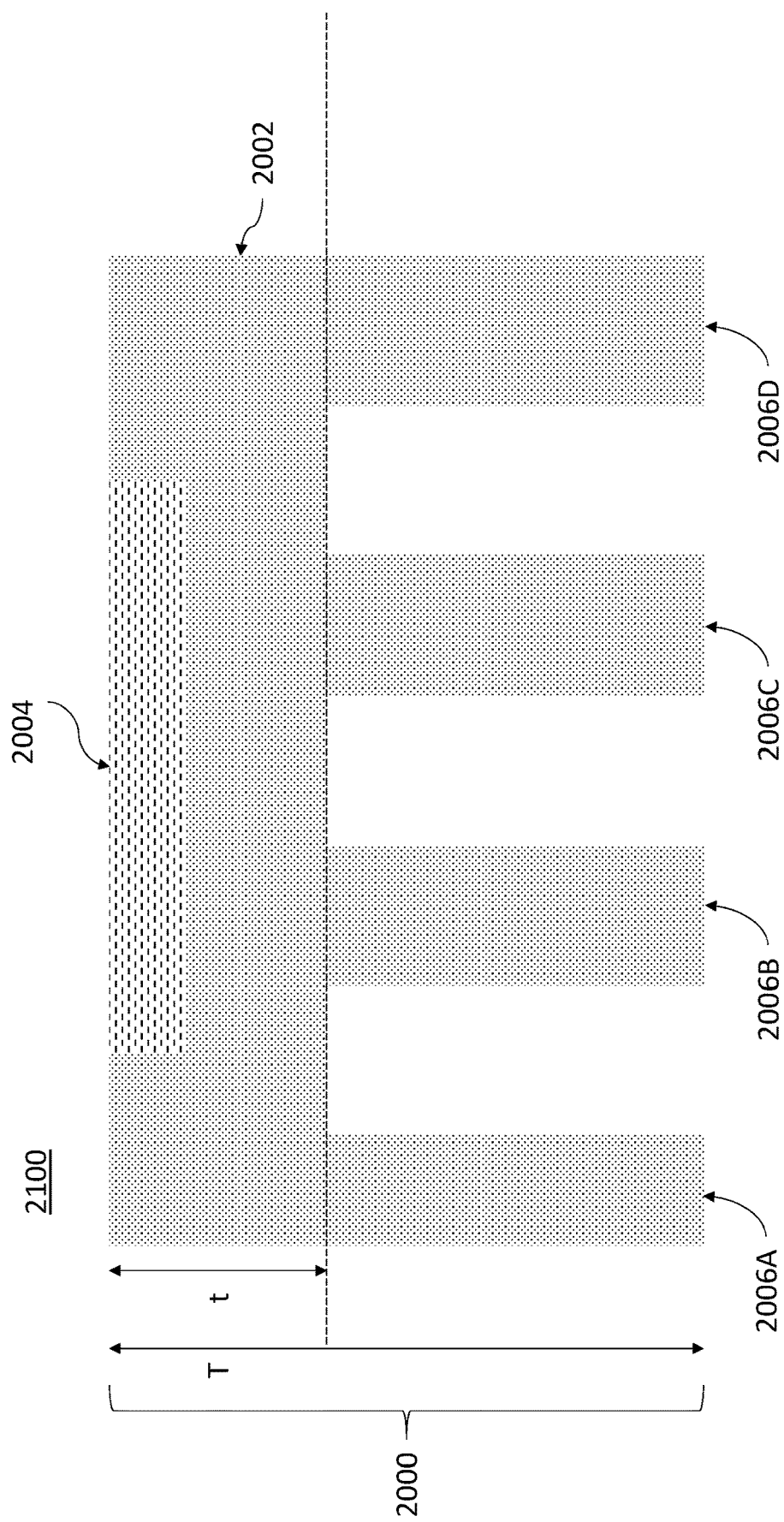
FIG. 14A is a cross-sectional view of a thinned structure 2100.

FIG. 14A is a cross-sectional view of a thinned structure 2100. Structure 2100 is substantially similar to structure 1900, except that a plurality of trenches have been formed in the thinning process creating a plurality of ribs 2006A-D. Like with the figures described above, for brevity, descriptions of elements within FIG. 14A that have already been discussed are omitted here, but may be found in the above discussion. In FIG. 14A, the active device region 2004 is not aligned with the plurality of trenches.

Figure 14B:
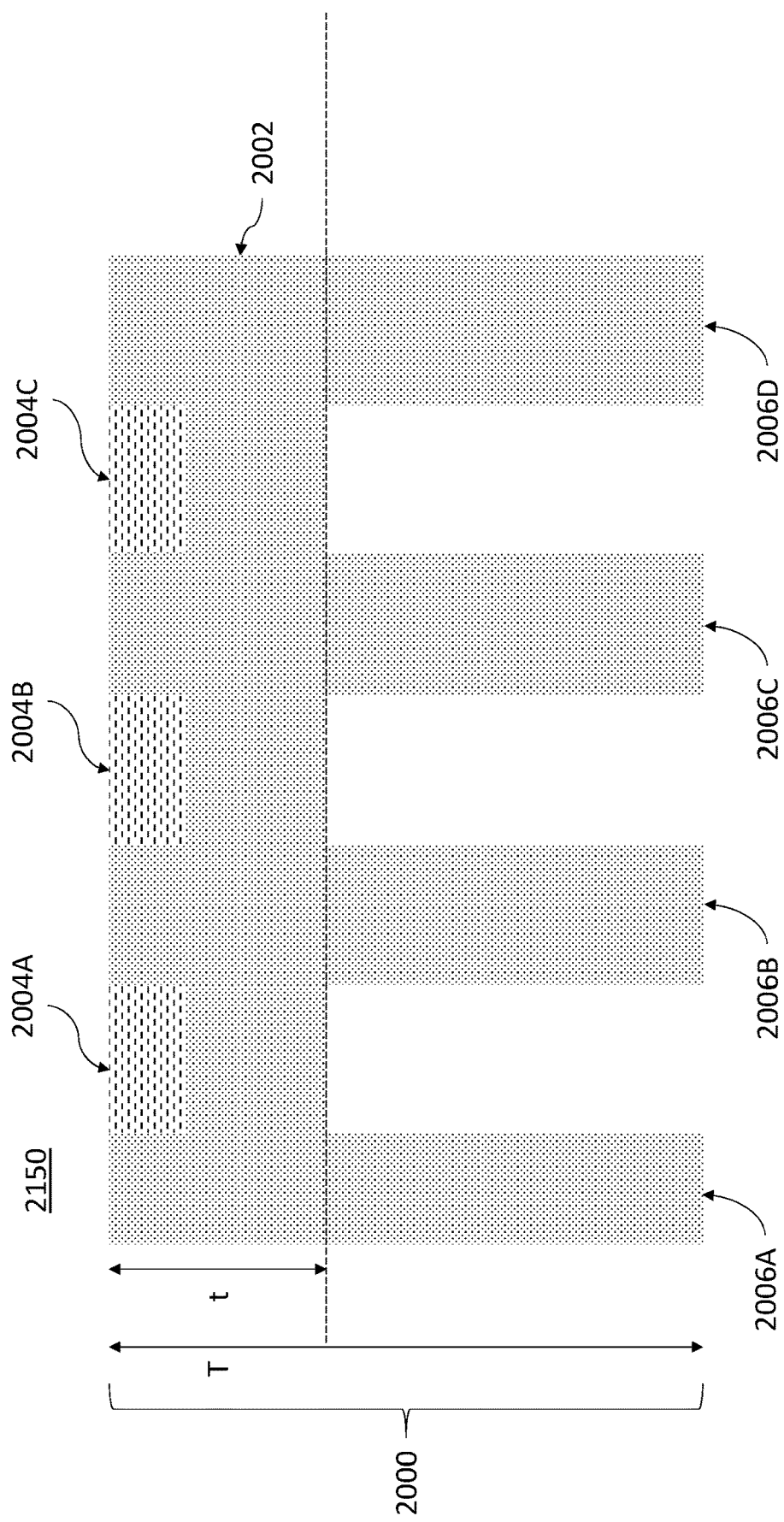
FIG. 14B is a cross-sectional view of a thinned structure 2150.

FIG. 14B is a cross-sectional view of a thinned structure 2150. Structure 2150 is substantially similar to structure 1900, except that (i) a plurality of active regions 2004A-C are provided in the thinned region 2002, and (ii) additional regions on the second side of the substrate 2000 have been thinned resulting in a plurality of ribs 2006A-D. Like with the figures described above, for brevity, descriptions of elements within FIG. 14B that have already been discussed are omitted here, but may be found in the above discussion. In FIG. 14B the trenches formed by the thinning process are aligned with the active device regions 2004A-C.

Figure 15:
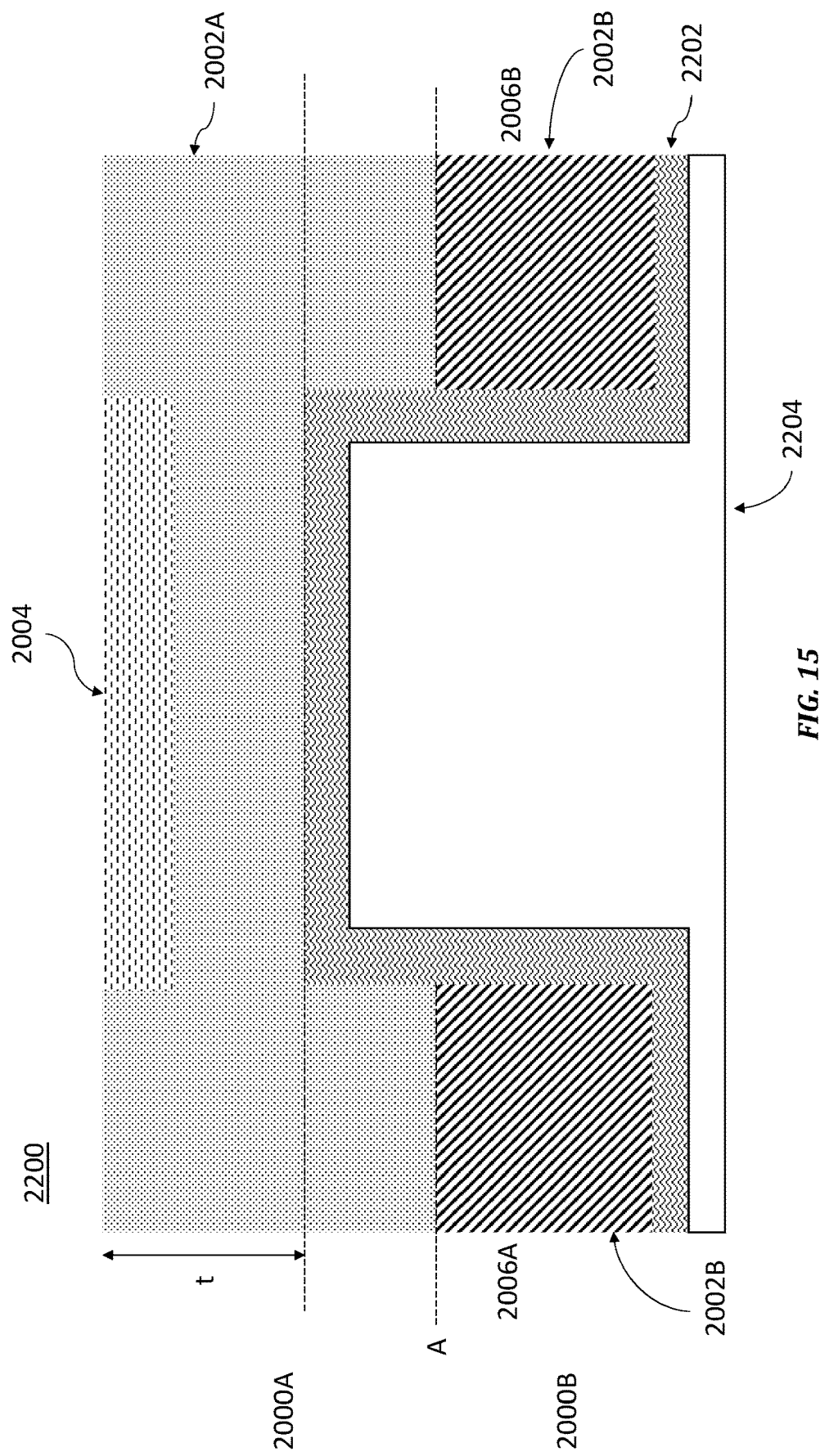
FIG. 15 is a cross-sectional view of a structure 2200.

FIG. 15 is a cross-sectional view of a structure 2200. Structure 2200 has been formed by thinning a substrate 2000 to form a thinned region 2002A and ribs 2006A and 2006B. In this embodiment, the substrate 2000 is a composite substrate comprising a n-type top portion 2000A and a bottom portion that may comprise an n-type material, a semi-insulating material, or an insulating material 2000B. In FIG. 15, the dividing line between the top and bottom portions 2000A and 2000B is indicated by line A. Of course, the location of line A, and thus the division between the top and bottom portions 2000A and 2000B, may be moved up or down in FIG. 15. The top portion 2000A of substrate 2000 in FIG. 15 includes the thinned region 2002A, in which an active device region 2004 is formed. The ribs 2006A and 2006B are at least partially formed by bottom portion material 2002B. Within the trench formed by the thinning process, an ohmic metal 2202 has been provided. Filling the trench formed by the thinning process and abutting the ohmic metal 2202 is a plated metal or solder region 2204.

Figure 16:
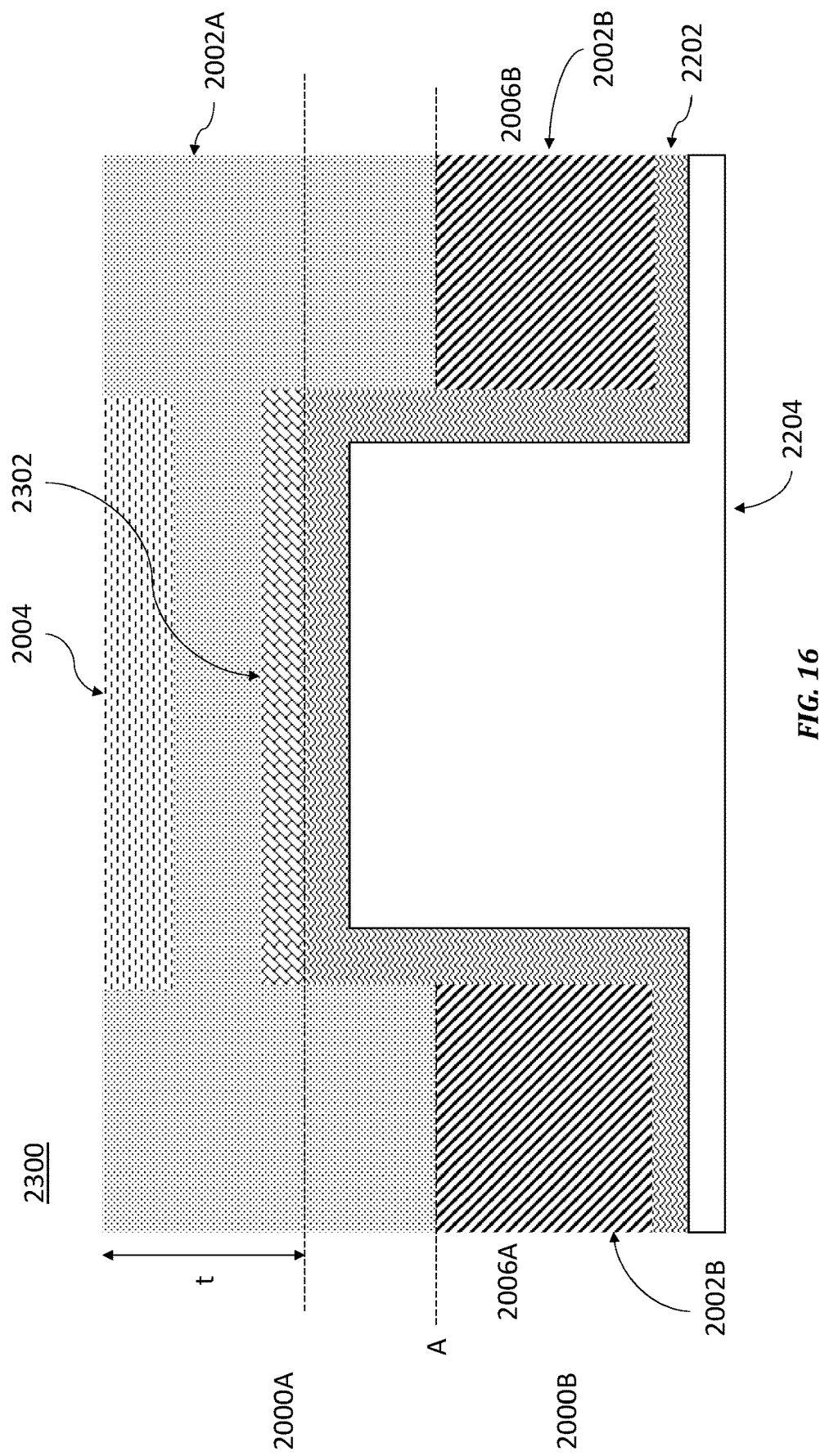
FIG. 16 is a cross-sectional view of a structure 2300.

FIG. 16 is a cross-sectional view of a structure 2300. Structure 2300 is substantially identical to structure 2200 in FIG. 15, except that an n-type region 2302 is provided abutting the ohmic metal 2202 and spreading across the width of the trench formed by the thinning process. Like with the figures described above, for brevity, descriptions of elements within FIG. 16 that have already been discussed are omitted here, but may be found in the above discussion.

Figure 17:
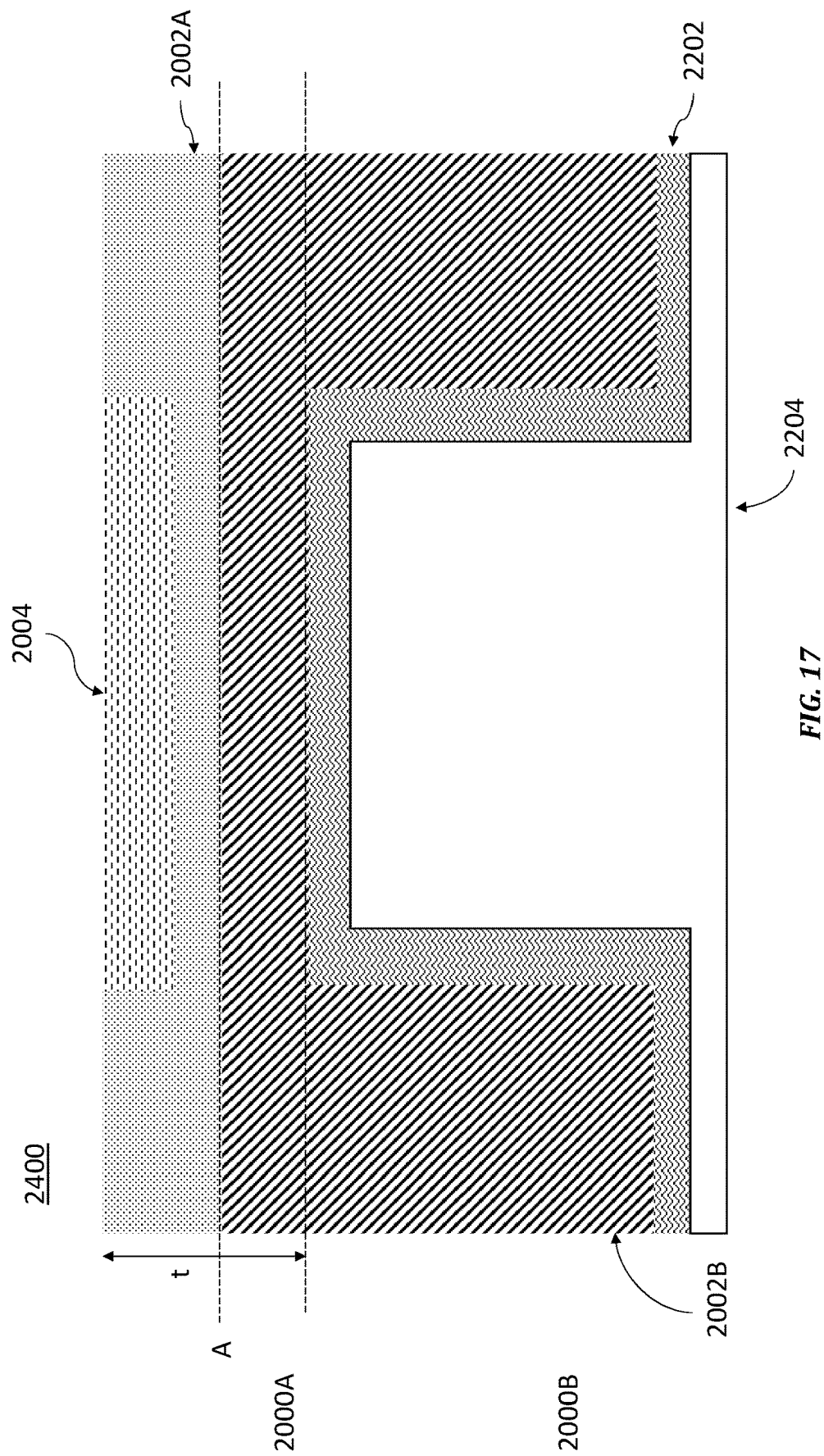
FIG. 17 is a cross-sectional view of a structure 2400.

FIG. 17 is a cross-sectional view of a structure 2400. Structure 2400 is substantially identical to structure 2200 in FIG. 15, except the bottom portion 2000B of the substrate extends further vertically into the thinned region 2002A. As a result, the bottom portion 2000B forms a single region, as opposed to two regions 2006A and 2006B. Like in FIG. 15, region 2006C may be an n-type material, a semi-insulating material, or an insulating material. Like with the figures described above, for brevity, descriptions of elements within FIG. 17 that have already been discussed are omitted here, but may be found in the above discussion.

Figure 18:
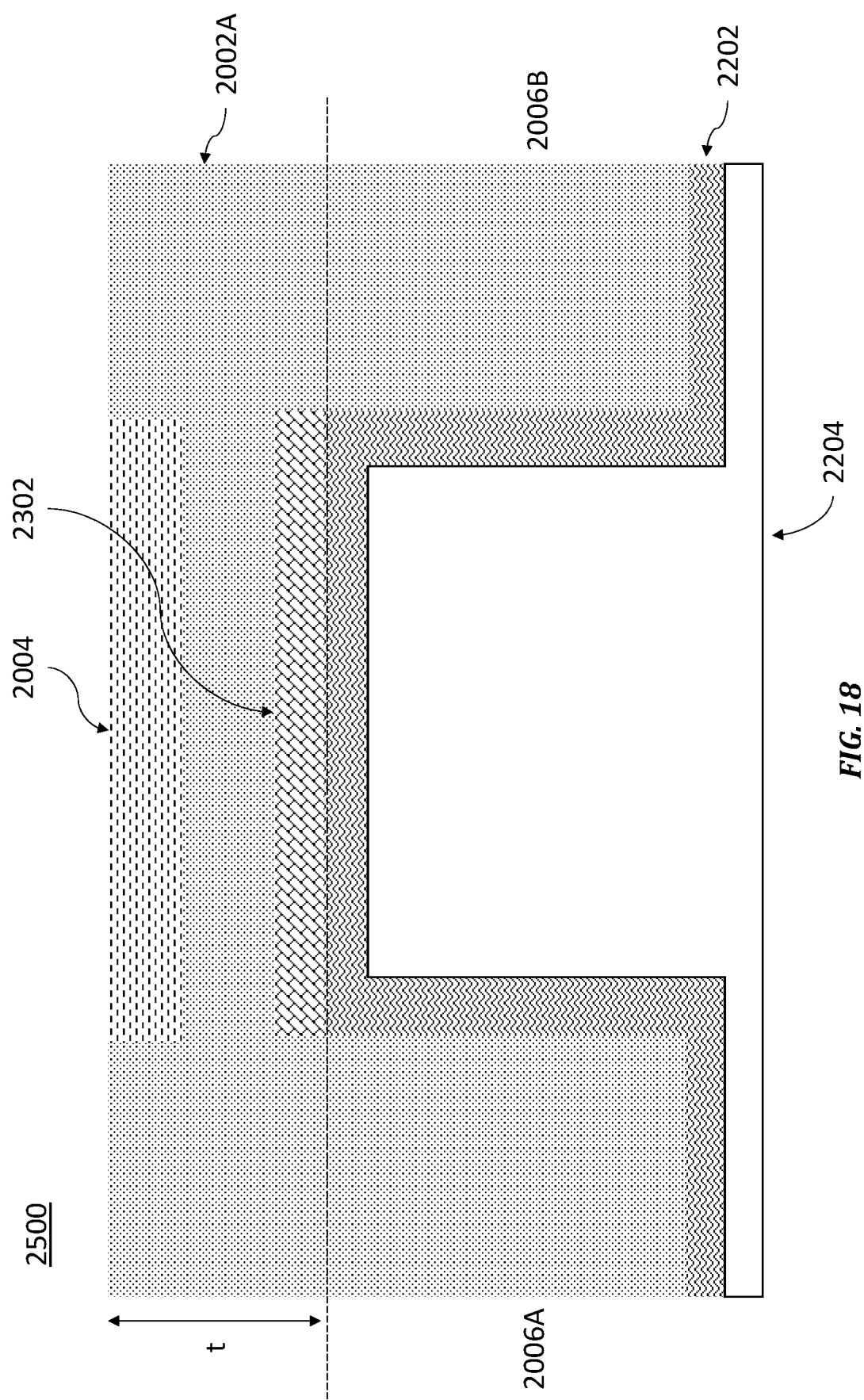
FIG. 18 is a cross-sectional view of a structure 2500.

FIG. 18 is a cross-sectional view of a structure 2500. Structure 2500 is substantially identical to structure 2300 in FIG. 16, except the substrate is a single n- type wafer substrate and thus does not comprise the bottom portion 2000B. Like with the figures described above, for brevity, descriptions of elements within FIG. 18 that have already been discussed are omitted here, but may be found in the above discussion.

Figure 19:
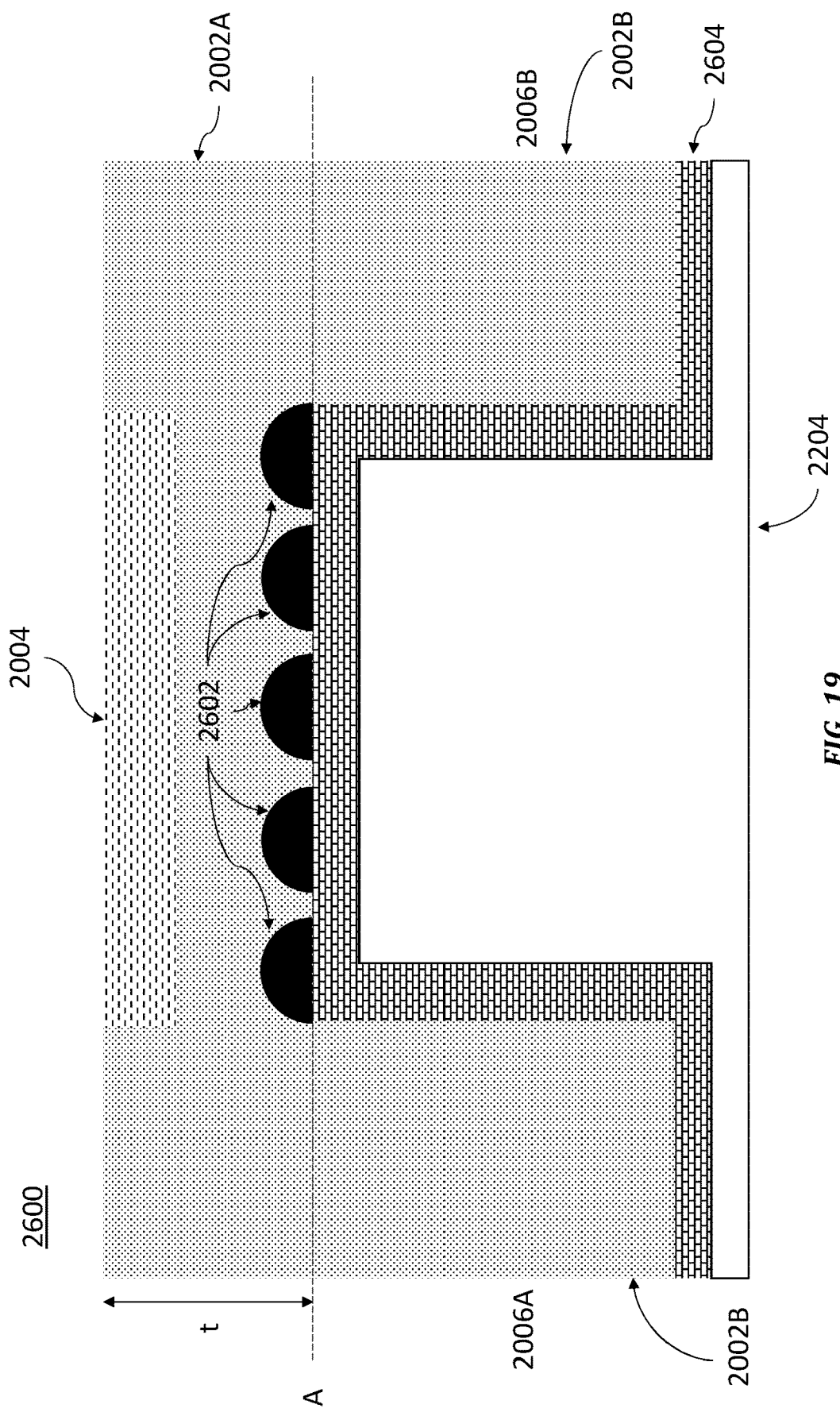
FIG. 19 is a cross-sectional view of a structure 2600.

FIG. 19 is a cross-sectional view of a structure 2600. Structure 2600 is substantially identical to structure 2500 with two exceptions. First, instead of n-type region 2302 a plurality of n-type half spheres 2602 are formed. Second those half spheres 2602 abut a Schotky metal contact region 2604. Spheres 2602 may, in one embodiment, comprise an ohmic metal. Like with the figures described above, for brevity, descriptions of elements within FIG. 19 that have already been discussed are omitted here, but may be found in the above discussion.

Figure 20:
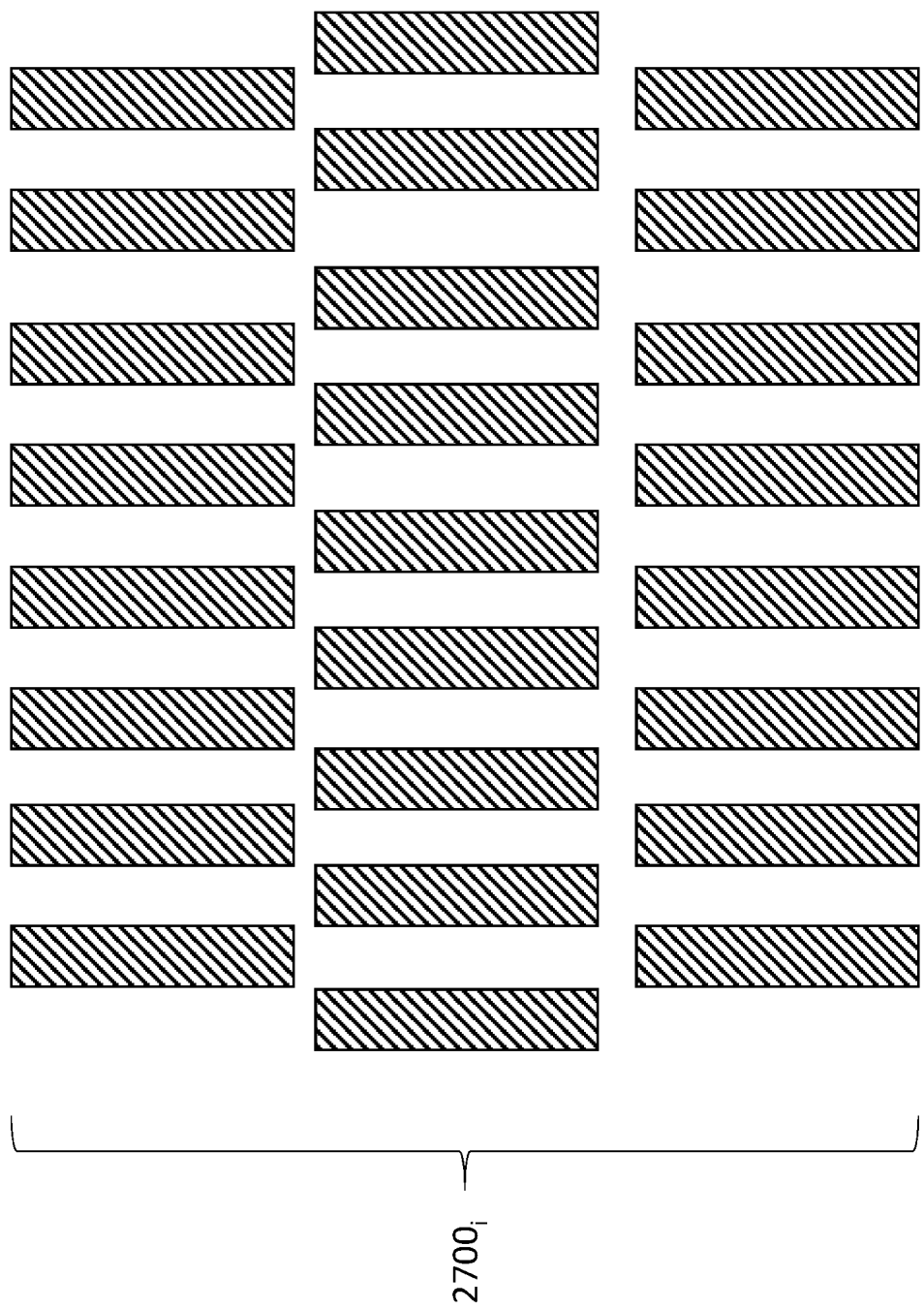
FIG. 20 is a bottom view of a substrate comprising non-contiguous trenches.
Figure 21:
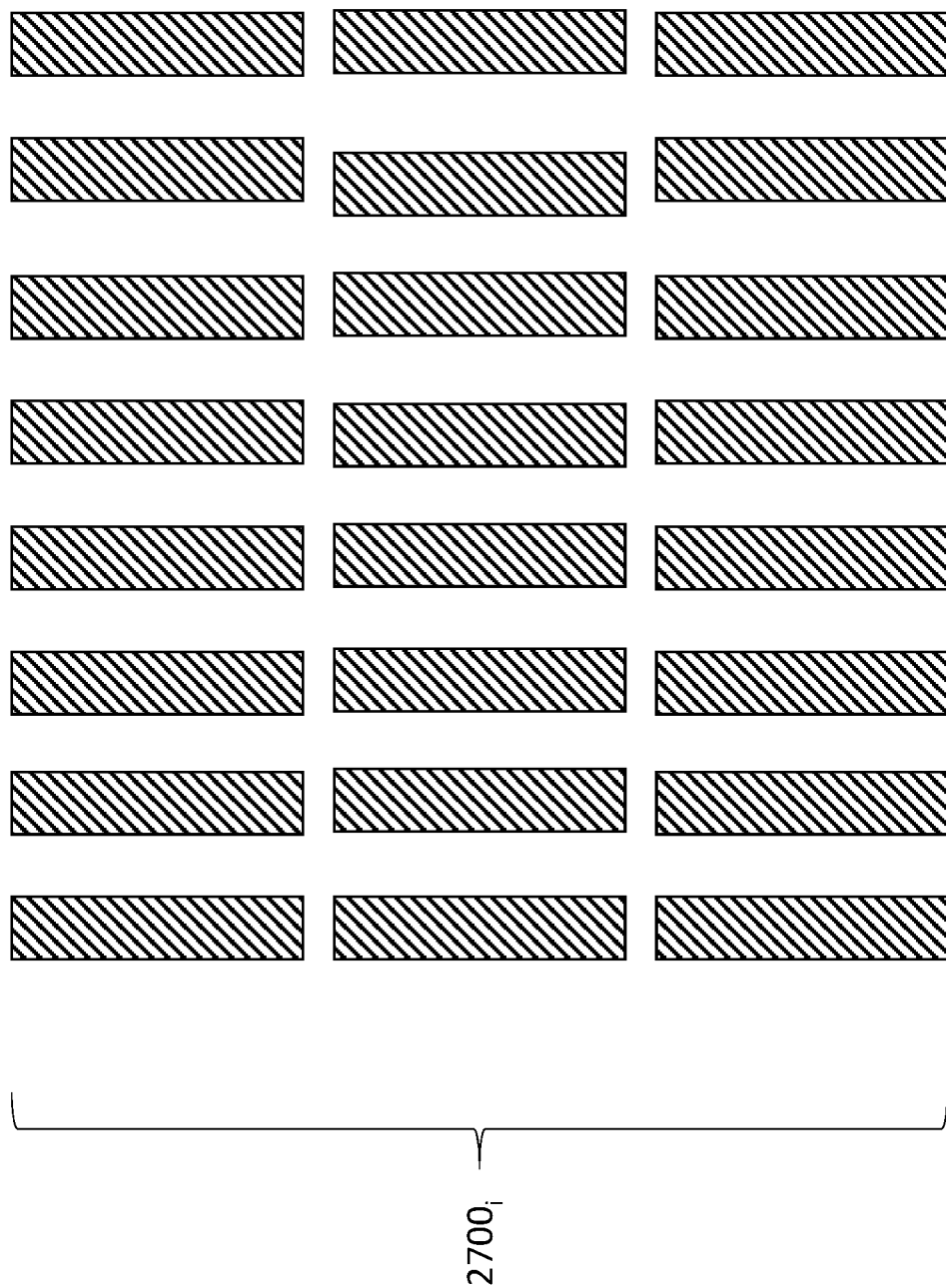
FIG. 21 is a bottom view of a substrate comprising contiguous trenches.

As described above, the areas where thinning occurs on the second side of substrate can be selected to achieve desired effects. One approach is to have no alignment of the trenches on the second side of the substrate to the active device regions on the first side of the substrate, as illustrated in FIG. 14A. The trenches 2700 may also be formed in a non-contiguous manner on the second side of the substrate, as illustrated in FIG. 20, such that one row of trenches is offset relative to another row of trenches. Trenches 2700$i$ may also be arranged in a contiguous manner as illustrated in FIG. 21. Another approach is to have an alignment between the trenches and the active device regions such that a rib of support is left between each pair of active device regions.

As described above, etching may be used to form the trenches. It is preferable to control the depth of the etch and as such etch stops may be provided between layers of a composite substrate to achieve that purpose. One class of etch stops that may be used include silicide, refractory metal, or eutectic (typically golf-silicon eutectic) layers at the interface of a substrate wafer and n- base layer by wafer bonding. If these materials make ohmic contact to n+ doping regions on the n- base layer side of the silicide, eutectic, or refractory metal, then it is not necessary to etch away these corresponding layers. These materials are excellent etch stops and allow a 400 micron wafer to be thinned down to as low as 25 microns in the selected regions.

In another embodiment, an oxide or nitride materials can be used as an etch stop at the interface of the substrate wafer and the n- base layer by wafer bonding. These materials are excellent etch stops. The insulator layer would be etched to reach the backside of the n- base layer, and n+ implant of Schottky metal contacts may be formed on the backside of the n- base layer to implement the structures. Because oxide and or nitride are such excellent etch stop layers, wafer thicknesses of 400 microns can be used that may then be thinned down to as low as 25 microns in selected regions.

Still further, in another embodiment, a high temperature polymer may be used as a glue etch stop. A layer of polymer material will typically convert to an amorphous carbon layer when heated to 500-700 degrees Celsius. Thus, a polymer glue may be used to glue two wafers together with one of the wafers being used to form the n- based (after thinning to approximately 100 microns) of a vertical conducting power device. During the high temperature processing steps of the vertical conducting power device, the polymer glue will be converted to an amorphous carbon layer that can act as an etch stop for a deep etch down to the final desired thickness. After the deep etch, the carbon layer will be etched and N+ implants or Schottky metal contacts will be provided.

Through the above methods, devices such as VJFETs 300-1300, 1700, and 1800 and MOSFETs 1400-1600 may be formed on a substrate which is then thinned to reduce the overall thickness of the device. Another exemplary method for forming a device on a thinned substrate will be described below.

Figure 22:
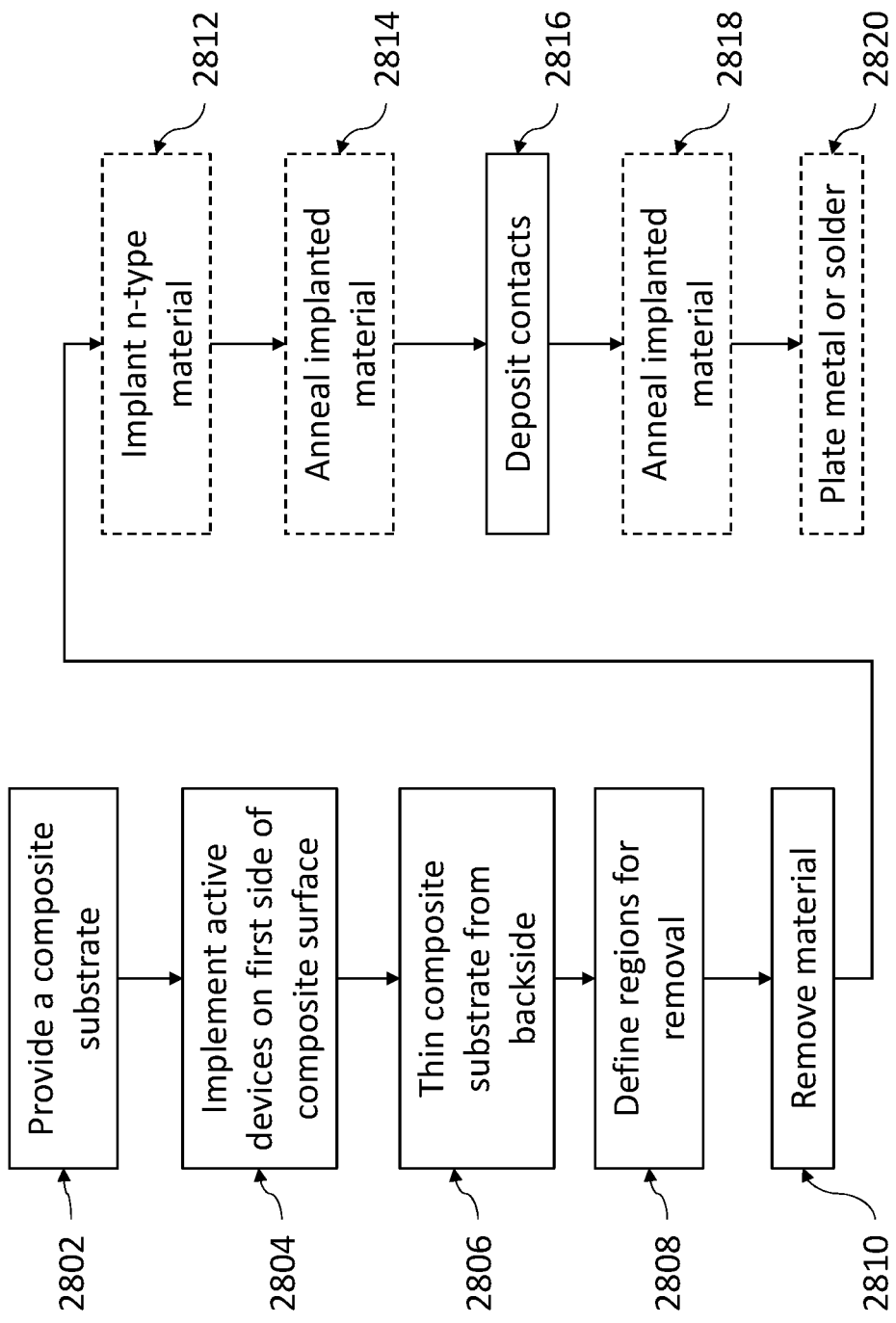
FIG. 22 illustrates a method of forming a device on a thinned substrate.

FIG. 22 illustrates one method of forming a device on a thinned substrate. The devices formed by this method may be include any of the devices described above. In S2802, a composite substrate is provided. The composite substrate may have an n-type epitaxial layer on an n-type substrate. Next, active device(s) (such one of the devices described above) is provided in S2804 on and/or within a surface on a first side of the composite substrate. In a preferred embodiment, the surface on the first side is the n-type epitaxial layer, such as β-$Ga_2O_3$. Next, in S2806, the composite substrate is thinned from a second side using grinding and/or etching to reduce the thickness of the substrate to approximately 30-200 microns. Next, in 2808, photolithography may be used to define areas on the second side for furthering etching to form trenches. As noted above, the trenches may be aligned with the active devices or non-aligned with the active devices. In the latter case, no alignment is necessary and thus a glass plate with the desired pattern can be placed on the second side and used to expose the photoresist. Instead of a glass plate, a wire mesh with approximately 20 micron thick wires spaced 20 microns apart may be used as a mask for RIE etching, rendering the photolithography step unnecessary. In the case where the trenches are aligned with the active devices, a thinning device may be used to hold the mask and the substrate with the formed active regions in the proper alignment.

Next, in S2810, the regions defined for removal are removed by etching, including reactive ion etching (RIE), chemical etching, isotropic chemical etching, anisotropic chemical etching, plasma etching, anisotropic plasma etching, and isotropic plasma etching. A chemical clean may optionally be used after RIE etching to remove polymers and heavy metals such that the trench does not extend all of the way through the substrate to the epitaxial layer. N-type material may be implanted in step S2812 into the trenches in the range of $1\times10^{15}$ cm$^{-2}$ to $1\times10^{16}$ cm$^{-2}$ to facilitate ohmic contact. In one embodiment, higher energy N-type material may be implanted to form an N-type buffer for a non-punch through FET.

In S2814, an optional step of annealing may be performed to activate the ion implanted dopant. In one embodiment, the annealing is performed by laser annealing. Next, in S2816, an ohmic contact metal is deposited to form a 0.5 to 1 micron thick layer. Atomic layer deposition may be used to implement a conformal metal coating. Next, in S2818, an optional annealing step may be performed to improve the ohmic contact and/or activate ion implanted dopants. Finally, in S2820, an optional step of plating metal or solder may be performed to increase the strength of the wafer and make contact to the metal in trench. This step also provides a thermoconductive layer to disperse heat generated by the active devices.

While various example embodiments of the invention have been described above, it should be understood that they have been presented by way of example, and not limitation. It is apparent to persons skilled in the relevant art(s) that various changes in form and detail can be made therein. Thus, the disclosure should not be limited by any of the above described example embodiments, but should be defined only in accordance with the following claims and their equivalents.

In addition, it should be understood that the figures are presented for example purposes only. The architecture of the example embodiments presented herein is sufficiently flexible and configurable, such that it may be utilized and navigated in ways other than that shown in the accompanying figures.

Further, the purpose of the Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the example embodiments presented herein in any way. It is also to be understood that the procedures recited in the claims need not be performed in the order presented.

What is claimed is:

1. A vertical current conducting device, comprising:
   an n+ beta-gallium oxide layer;
   an n– beta-gallium oxide layer disposed on the n+ beta-gallium oxide layer, wherein the n– beta-gallium oxide layer includes a current channel;
   a plurality of p-type gates disposed on opposite sides of the current channel;
   a plurality of p-type terminations disposed on a side of the n– beta gallium oxide layer that is distal from the n+ beta-gallium oxide layer; and
   a source disposed on a distal side of the current channel with respect to the n+ beta-gallium oxide layer.

2. The device according to claim 1, further comprising:
   a plated copper layer substrate, wherein the n+ beta-gallium oxide layer is disposed on the plated copper layer substrate.

3. The device according to claim 2, wherein the plated copper layer substrate is directly bonded to the n+ beta gallium oxide layer.

4. The device according to claim 1, further comprising:
   a plurality of nucleation layers respectively corresponding to the plurality of p-type terminations, wherein each nucleation layer is provided between the corresponding p-type termination and the n– beta-gallium oxide layer.

5. The device according to claim 4, further comprising:
   wherein the plurality of p-type gates comprise diamond, the plurality of p-type terminations comprise diamond, and the plurality of nucleation layers are diamond nucleation layers.

6. The device according to claim 1, wherein when a forward bias is applied to the plurality of p-type gates, charge carriers in the current channel enter a conduction band.

7. The device according to claim 6, wherein when a reverse bias is applied to the plurality of p-type gates, charges carriers are depleted from the current channel.

8. The device according to claim 1, further comprising:
   at least one nucleation layer provided between the current channel and each of the plurality of p-type gates.

9. The device according to claim 8, further comprising:
   a wideband gap oxide layer disposed between the nucleation layer and each of the plurality of p-type gates.

10. The device according to claim 1, wherein the plurality of p-type gates are L-shaped.

11. The device according to claim 1, wherein a thickness of the current channel and the source is substantially the same as a thickness of the plurality of p-type gates in a direction perpendicular to the n+ beta-gallium oxide layer.

12. The device according to claim 1, wherein the plurality of p-type gates are disposed at least partially within the n– beta-gallium oxide layer.

13. The device according to claim 12, further comprising:
   a plurality of nucleation layers respectively corresponding to the plurality of p-type gates, wherein each nucleation layer partially surrounds the corresponding p-type gate such that the p-type gates does not directly contact the n– beta-gallium oxide layer.

14. The device according to claim 1, further comprising:
   a plurality of nucleation layers respectively corresponding to the plurality of p-type terminations, wherein the plurality of p-type terminations are disposed at least partially within the n– beta-gallium oxide layer and each nucleation layer partially surrounds the corresponding p-type termination such that the p-type termination does not directly contact the n– beta-gallium oxide layer.

15. The device according to claim 1, further comprising:
   a plurality of ion-implanted regions,
   wherein each of the plurality of ion-implanted regions is disposed adjacent to one of the plurality of p-type gates or one of the plurality of p-type terminations.

* * * * *